(12) United States Patent
Xu et al.

(10) Patent No.: US 11,037,794 B2
(45) Date of Patent: Jun. 15, 2021

(54) METHODS FOR MULTIPLE-PATTERNING NANOSPHERE LITHOGRAPHY FOR FABRICATION OF PERIODIC THREE-DIMENSIONAL HIERARCHICAL NANOSTRUCTURES

(71) Applicant: The Regents of the University of California, Oakland, CA (US)

(72) Inventors: Xiaobin Xu, Los Angeles, CA (US); Qing Yang, Los Angeles, CA (US); Natcha Wattanatorn, Los Angeles, CA (US); Chuanzhen Zhao, Los Angeles, CA (US); Logan A. Stewart, Los Angeles, CA (US); Steven J. Jonas, Hawthorne, CA (US); Paul S. Weiss, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/583,101

(22) Filed: Sep. 25, 2019

(65) Prior Publication Data
US 2020/0098577 A1 Mar. 26, 2020

Related U.S. Application Data

(60) Provisional application No. 62/737,018, filed on Sep. 26, 2018.

(51) Int. Cl.
*H01L 21/308* (2006.01)
*H01L 21/3065* (2006.01)
(Continued)

(52) U.S. Cl.
CPC ...... *H01L 21/3083* (2013.01); *H01L 21/3065* (2013.01); *B81C 1/0046* (2013.01);
(Continued)

(58) Field of Classification Search
CPC ............ H01L 21/3083; H01L 21/3065; H01L 21/30655; H01L 31/0232; H01L 31/00;
(Continued)

(56) References Cited

U.S. PATENT DOCUMENTS 4,407,695 A * 10/1983 Deckman ................. B41M 5/24
204/192.34
6,835,317 B2 * 12/2004 Hatamura ............ G11B 5/1871
216/11
(Continued)

OTHER PUBLICATIONS

Chen, Kai et al., Moiré Nanosphere Lithography, ACSNano, vol. 9, No. 6, 6031-6040 (2015).
(Continued)

*Primary Examiner* — Anita K Alanko
(74) *Attorney, Agent, or Firm* — Vista IP Law Group LLP

(57) ABSTRACT

A robust and general fabrication/manufacturing method is described herein for the fabrication of periodic three-dimensional (3D) hierarchical nanostructures in a highly scalable and tunable manner. This nanofabrication technique exploits the selected and repeated etching of spherical particles that serve as resist material and that can be shaped in parallel for each processing step. The method enables the fabrication of periodic, vertically aligned nanotubes at the wafer scale with nanometer-scale control in three dimensions including outer/inner diameters, heights/hole-depths, and pitches. The method was utilized to construct 3D periodic hierarchical hybrid silicon and hybrid nanostructures such as multi-level solid/hollow nanotowers where the height and diameter of each level of each structure can be configured precisely as well as 3D concentric plasmonic supported metal nanodisk/nanorings with tunable optical properties on a variety of substrates.

19 Claims, 15 Drawing Sheets

(51) Int. Cl.
  *B81C 1/00* (2006.01)
  *B82Y 40/00* (2011.01)
(52) U.S. Cl.
  CPC ....... *B81C 1/00111* (2013.01); *B81C 1/00404* (2013.01); *B81C 1/00484* (2013.01); *B81C 1/00531* (2013.01); *B81C 2201/014* (2013.01); *B81C 2201/0112* (2013.01); *B81C 2201/0132* (2013.01); *B82Y 40/00* (2013.01); *H01L 21/30655* (2013.01)
(58) Field of Classification Search
  CPC ... B82Y 40/00; B82Y 20/00; B81C 2201/014; B81C 1/00531; B81C 2201/0132; B81C 1/00484; B81C 1/0046; B81C 1/00111; B81C 1/00404; B81C 2201/0112; B82B 1/00; G01N 21/645; G01N 21/554; G02B 1/118; B81B 2203/0361
  See application file for complete search history.

(56) References Cited

U.S. PATENT DOCUMENTS

| | | | | |
|---|---|---|---|---|
| 8,501,020 | B2 * | 8/2013 | Zhu | B81C 1/00031 216/11 |
| 9,675,790 | B2 * | 6/2017 | Stoeber | B81C 1/00111 |
| 9,993,948 | B2 * | 6/2018 | Zhang | B08B 17/065 |
| 2008/0047929 | A1 * | 2/2008 | Wang | G02B 3/0012 216/24 |
| 2017/0110330 | A1 * | 4/2017 | Choi | G03F 7/0002 |

OTHER PUBLICATIONS

Colson, Pierre et al., Nanosphere Lithography: A Powerful Method for the Controlled Manufacturing of Nanomaterials, Hindawi Publishing Corporation Journal of Nanomaterials, vol. 2013, Article ID 948510, 19 pages, http://dx.doi.org/10.1155/2013/948510.

Haynes, Christy L. et al., Nanosphere Lithography: A Versatile Nanofabrication Tool for Studies of Size-Dependent Nanoparticle Optics, J. Phys. Chem. B 2001, 105, 5599-5611.

Huang, Zhipeng et al., Fabrication of Silicon Nanowire Arrays with Controlled Diameter, Length, and Density**, Adv. Mater. 2007, 19, 744-748.

Hulteen, John C. et al., Nanosphere lithography: A materials general fabrication process for periodic particle array surfaces, J. Vac. Sci. Technol. A 13(3), May/Jun. 1995, 1553-1558.

Jeong, Sangmoo et al., All-back-contact ultra-thin silicon nanocone solar cells with 13.7% power conversion efficiency, Nature Communications, 4:2950, DOI: 10.1038/ncomms3950, www.nature.com/naturecommunications.

Jeong, Sangmoo et al., Hybrid Silicon Nanocone-Polymer Solar Cells, dx.doi.org/10.1021/nl300713x, Nano Lett. 2012, 12, 2971-2976.

Kosiorek, Adam et al., Fabrication of Nanoscale Rings, Dots, and Rods by Combining Shadow Nanosphere Lithography and Annealed Polystyrene Nanosphere Masks, Small 2005, 1, No. 4, 439-444, DOI: 10.1002/smll.200400099.

Xu, Xiaobin et al., Multiple-Patterning Nanosphere Lithography for Fabricating Periodic Three-Dimensional Hierarchical Nanostructures, ACS Nano 2017, 11, 10384-10391.

Yu, Ye et al., Colloidal Lithography, http://dx.doi.org/10.5772/56576.

* cited by examiner

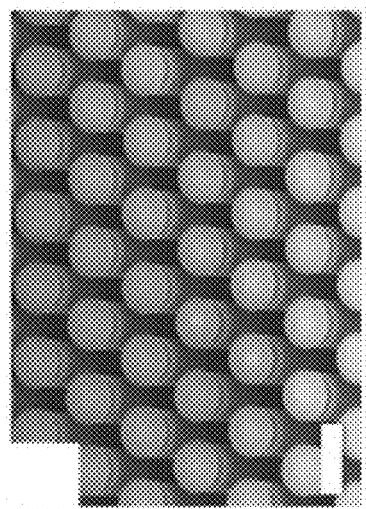
FIG. 1B
FIG. 1C
FIG. 1D
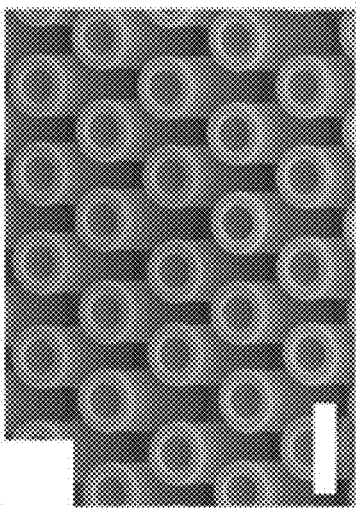
FIG. 1E
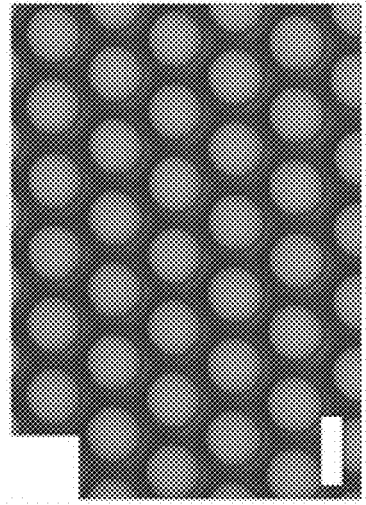
FIG. 1F
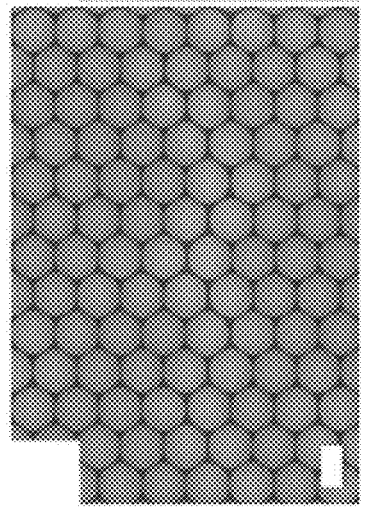
FIG. 1G
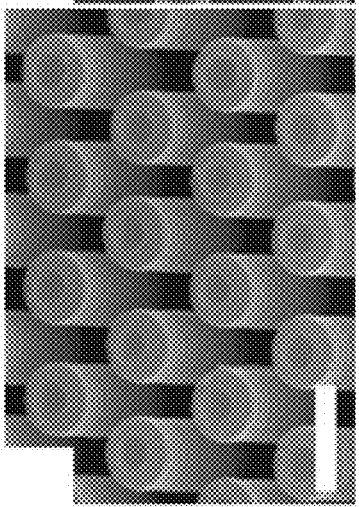

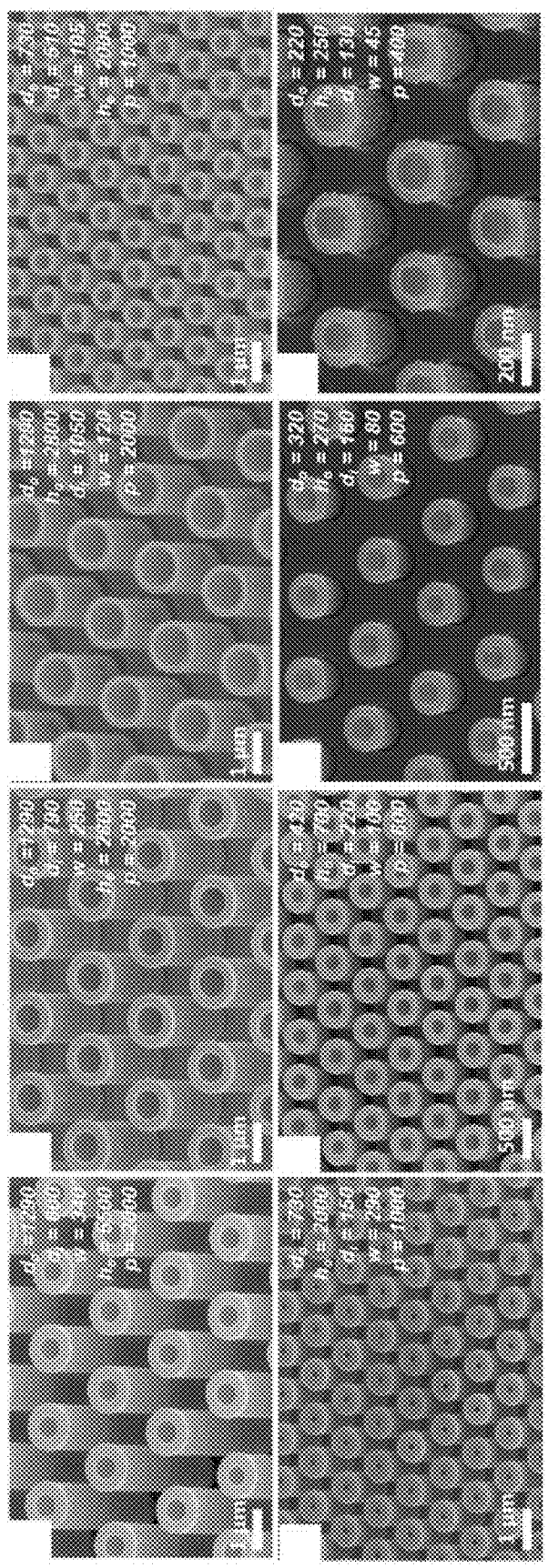

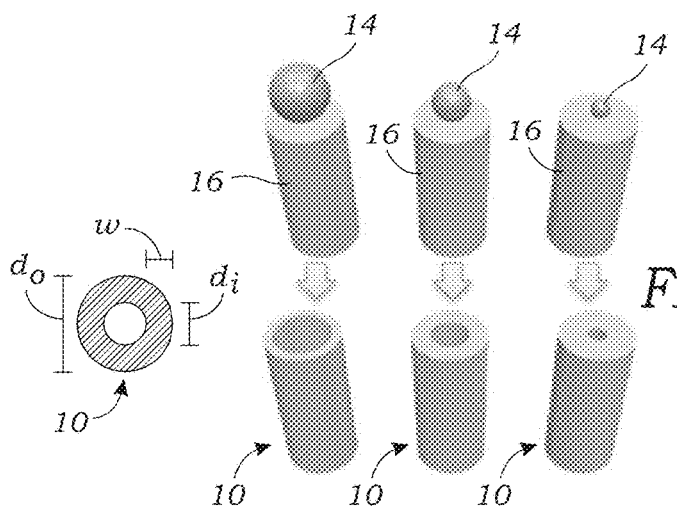
FIG. 4A
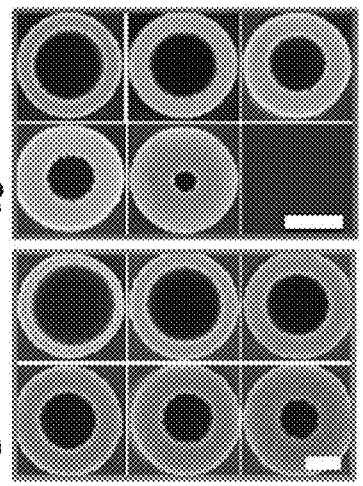
FIG. 4B
FIG. 4C
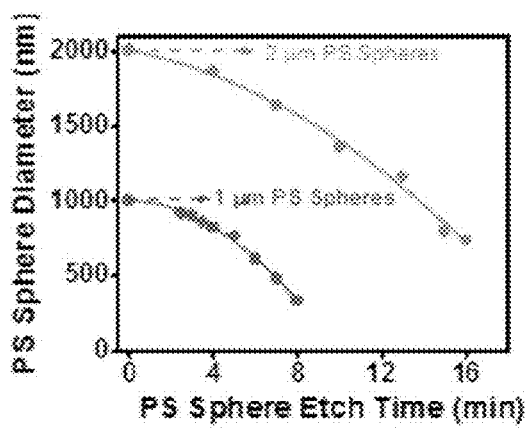
FIG. 4D
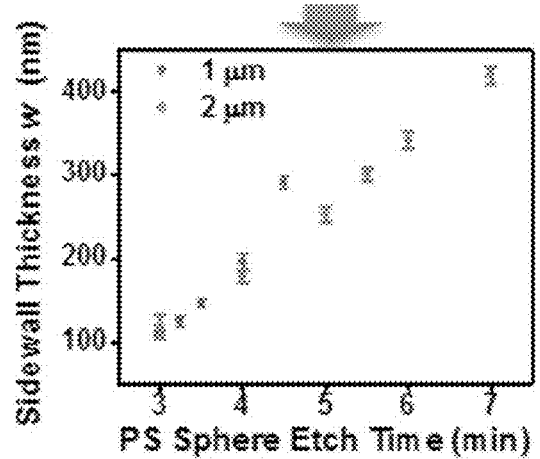
FIG. 4E
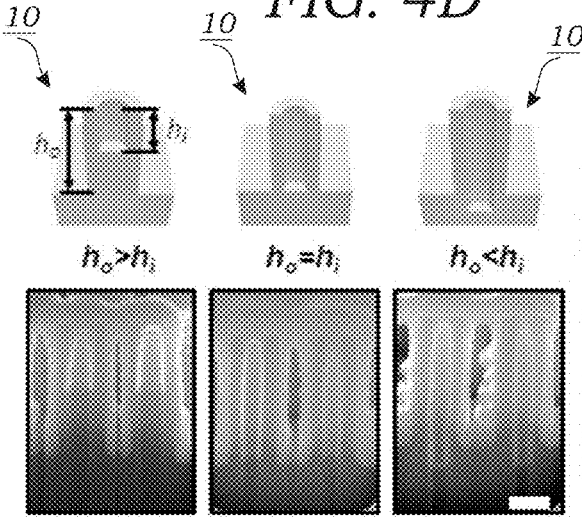
FIG. 4F
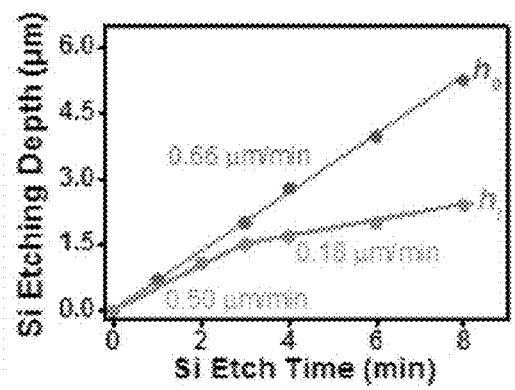
FIG. 4G

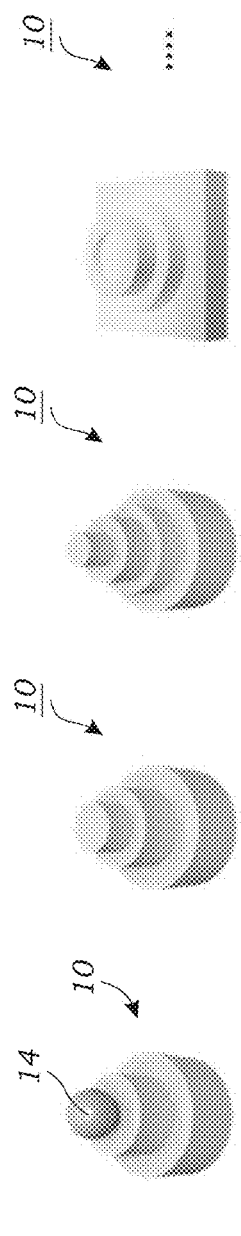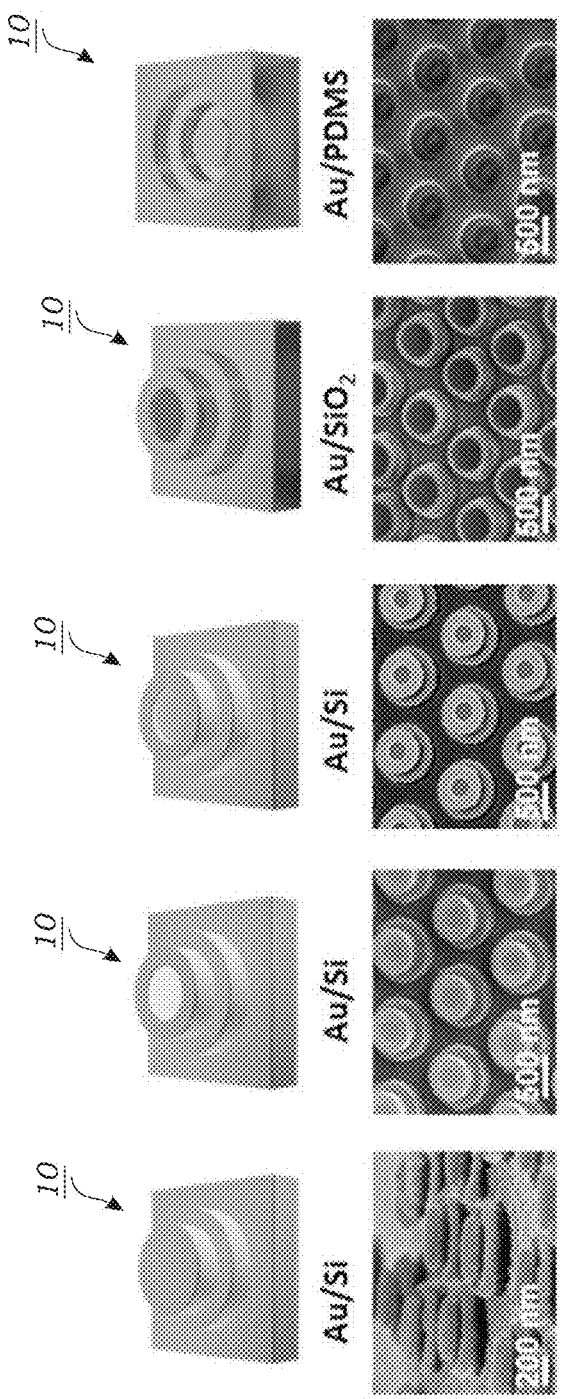
FIG. 5A  FIG. 5B  FIG. 5C  FIG. 5D
FIG. 5E  FIG. 5F  FIG. 5G  FIG. 5H  FIG. 5I

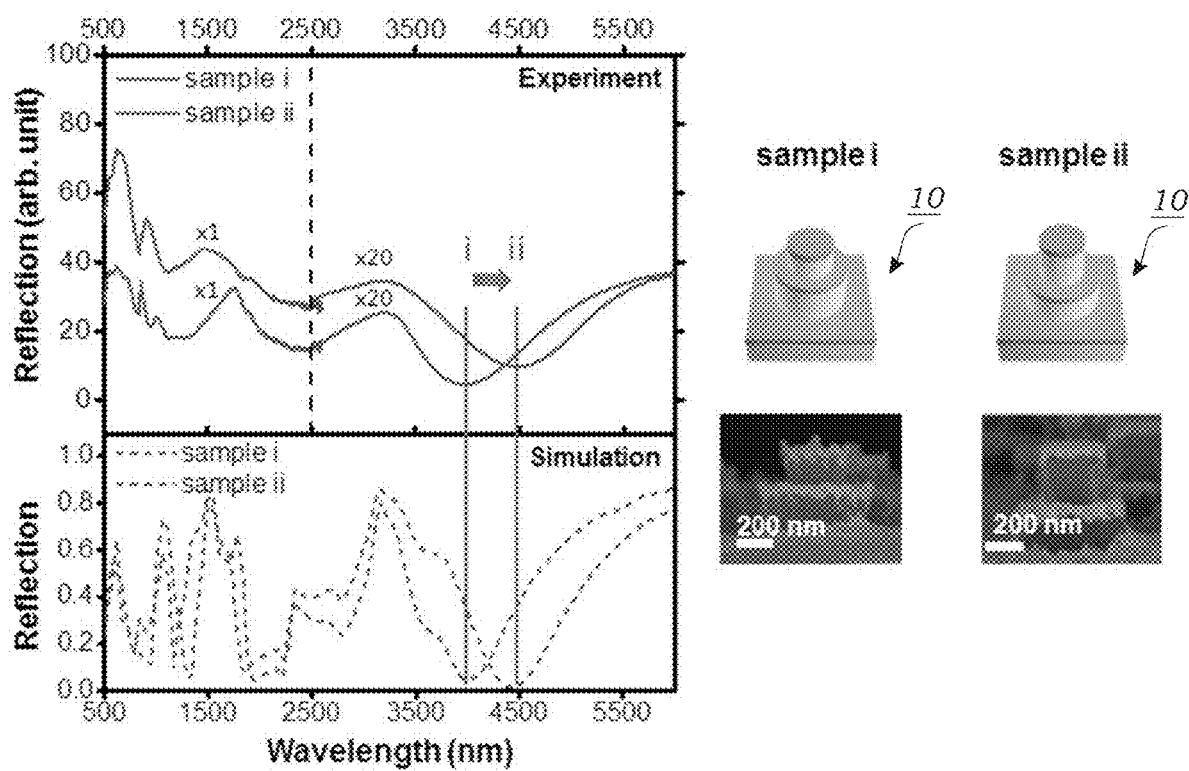
FIG. 5J
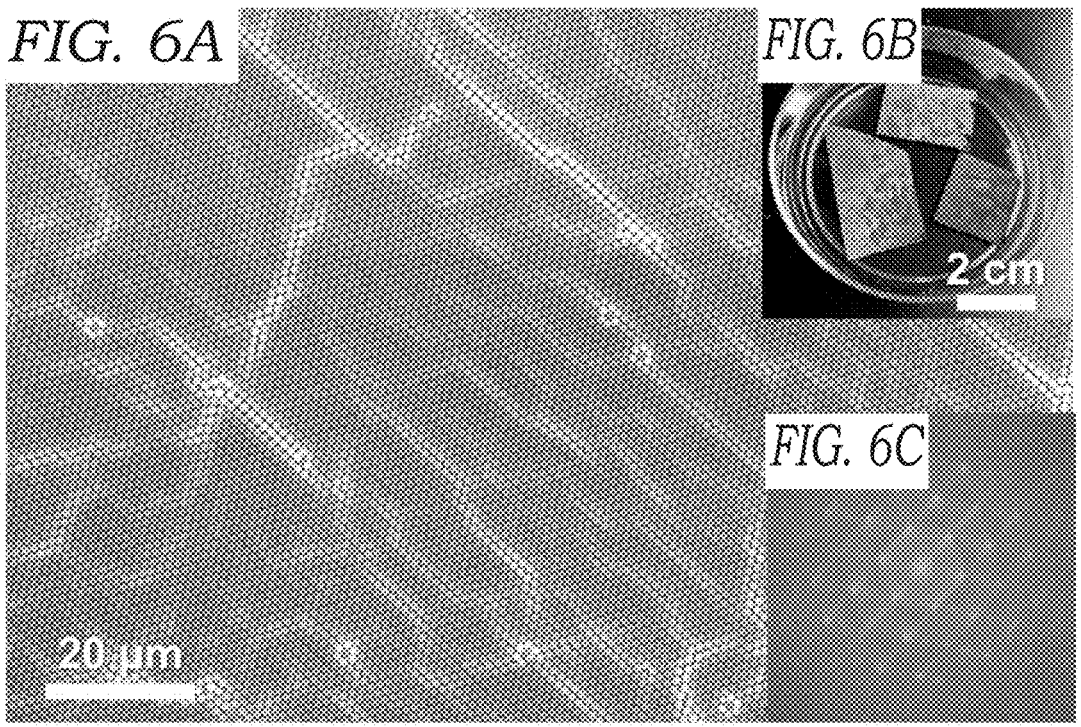
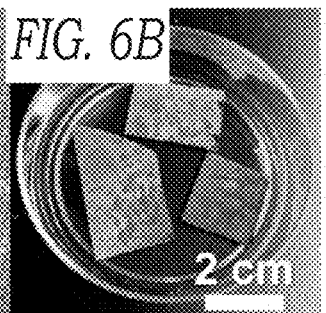
FIG. 6A  FIG. 6B  FIG. 6C

METHODS FOR MULTIPLE-PATTERNING NANOSPHERE LITHOGRAPHY FOR FABRICATION OF PERIODIC THREE-DIMENSIONAL HIERARCHICAL NANOSTRUCTURES

RELATED APPLICATION

This Application claims priority to U.S. Provisional Patent Application No. 62/737,018 filed on Sep. 26, 2018, which is hereby incorporated by reference in its entirety. Priority is claimed pursuant to 35 U.S.C. § 119 and any other applicable statute.

Statement Regarding Prior Disclosures by The Inventor or a Joint Inventor

The listed inventors to the current patent application have published aspects of the invention in the following publication: Xu et al., Multiple-Patterning Nanosphere Lithography for Fabricating Periodic Three-Dimensional Hierarchical Nanostructures, ACS Nano 2017, 11, 10, 10384-10391 (Sep. 28, 2017).

STATEMENT REGARDING FEDERALLY SPONSORED RESEARCH AND DEVELOPMENT

This invention was made with government support under Grant Number 1636136, awarded by the National Science Foundation. The Government has certain rights in the invention.

TECHNICAL FIELD

The technical field generally relates to methods used to manufacture or to fabricate periodic three-dimensional hierarchical nanostructures. In particular, the technical field relates to a general strategy called multiple-patterning nanosphere lithography (MP-NSL) for the fabrication of periodic three-dimensional (3D) hierarchical nanostructures in a highly scalable and tunable manner.

BACKGROUND

Periodic semiconductor nanostructures, such as needles, pyramids, holes, wires, pillars, tubes, cones, and volcanoes are increasingly applied in the design of solar cells, biosensors, biomaterials, and drug delivery systems due to their superior optical/electrical properties, biocompatibility, and mechanical properties. In particular, periodic single-crystalline silicon nanotubes assembled via electron-beam lithography and nanoimprint lithography demonstrate high light conversion efficiency in hybrid solar cells, while their biocompatibility and tubular structures also suggest their tantalizing potential as tools to enable improved studies of cellular mechanics, circulating tumor cell capture/release, and intracellular biochemical delivery. However, despite this interest and their broad applicability, the deployment of periodic nanotube-based devices with controlled dimensions has been limited by the lack of simple and scalable fabrication approaches for these structures.

One strategy for the fabrication of periodic nanostructures, including nanopillars, nanocones, and nanoholes involves nanosphere lithography, because of its low cost, simplicity, and high throughput compared to conventional nanolithographic methods including electron-beam lithography and focused ion beam milling. Nanosphere lithography employs periodic arrays of self-assembled close-packed mono-/bilayer nanospheres (e.g., polystyrene, $SiO_2$, and others) as masks to pattern underlying substrate materials. However, the fabrication of periodic nanotubes from silicon and other materials with precise dimensional control over large areas remains challenging due primarily to the nanosphere template being used only once during processing. This "one-time use" approach restricts traditional nanosphere lithography techniques in that only the outer diameter of nanotubes can be defined fully. For example, previous attempts to generate nanoring-like masks for silicon nanotube fabrication lacked suitable control over dimensions (such as tube thickness), quality, and reproducibility.

SUMMARY

In one embodiment, a method is described that circumvents the limitations of traditional one-time use methods by adopting a multiple-use template concept. This method, which is sometimes referred to herein as Multiple-Patterning Nanosphere Lithography (MP-NSL). The MP-NSL method achieves wafer-scale fabrication of a multiplicity of periodic nanostructures (e.g., silicon needles, tubes, pyramids, pillars, and towers) while enabling independent control over all structural dimensions during fabrication including heights, pitches, inner/outer diameters, and hole-depths for tubular structures. This degree of versatility and precision has not previously been reported for structures prepared via nanosphere lithography. Moreover, the MP-NSL technique represents a powerful three-dimensional (3D) nanolithographic tool for high-throughput fabrication of periodic hierarchical nanoarchitectures, enabling the assembly of multilevel solid or hollow nanotowers and 3D concentric plasmonic nanodisk/nanorings.

The MP-NSL method for manufacturing arrays of tubular features on a substrate includes assembling a monolayer of packed nanometer- or micrometer-sized spherical particles onto a substrate. The size of the packed spherical particles on the substrate is reduced by etching. The substrate with the reduced sized particles is then subject to deep reactive ion etching (DRIE) or other anisotropic etching process to generate an array of pillars on the surface of the substrate. The size of the particles is then reduced by an additional etching operation. A metal mask layer is then deposited on the array of pillars and the substrate. The particles are then removed from the substrate. The substrate with the array of pillars (and free of particles) is then subject to deep reactive ion etching (DRIE) (or another anisotropic etch process) to etch holes in the array of pillars to generate an array of tubes. The metal mask layer may then be removed.

In another embodiment, a method of manufacturing tower arrays on a substrate includes assembling a monolayer of packed nanometer- or micrometer-sized spherical particles onto the substrate. The size of the packed spherical particles on the substrate is reduced by etching. The substrate with the reduced size particles is subject to deep reactive ion etching (DRIE) (or other anisotropic etching process) to generate an array of pillars in the surface of the substrate. The size of the particles is reduced by an additional etching operation. The substrate with the array of pillars is then subject to deep reactive ion etching (DRIE) (or other anisotropic etching process) to generate multi-level towers. The particles may be removed from the substrate. The substrate with the tower arrays formed therein may be coated with a metal to enhance its plasmonic properties. The substrate with the tower arrays formed therein may also be used to pattern a reverse or relief structure using soft lithographic techniques.

BRIEF DESCRIPTION OF THE DRAWINGS

FIG. 1B illustrates scanning electron microscope (SEM) images of a monolayer of closed-packed polystyrene nanospheres (diameter: 1 µm) formed on a silicon wafer.

FIG. 1C illustrates scanning electron microscope (SEM) images of polystyrene nanoparticles on a wafer after the first size reduction and exposure to oxygen plasma.

FIG. 1D illustrates polystyrene nanoparticles on top of periodic silicon nanopillar arrays.

FIG. 1E illustrates a second size reduction of polystyrene nanoparticles by oxygen plasma (step 4)

FIG. 1F illustrates nickel nanorings formed on top of silicon nanopillars. The region displayed as dark (center) is silicon and the region displayed as bright (annulus) is Ni.

FIG. 1G illustrates etching of the inner regions by DRIE to form silicon nanotubes (step 7). Images of FIGS. 1D, 1E, 1G were taken at a tilt of 30°. Scale bars: 1 µm.

FIGS. 3A-3H illustrate scanning electron micrographs of representative periodic silicon nanotube arrays with different parameters in nm: pitch (p), outer diameter ($d_o$), inner diameter ($d_i$), sidewall thickness ($w=(d_o-d_i)/2$), and outer height ($h_o$). Images were recorded at a tilt of 30°. (Units: nm).

FIG. 4A is a schematic illustration of how the outer and inner diameters ($d_o$ and $d_i$ respectively) of silicon nanotubes may be adjusted or tuned. As seen in FIG. 4A, adjusting the size of the polystyrene nanoparticle can be used to adjust the inner diameter and sidewall thickness.

FIG. 4B illustrates top-view scanning electron microscopy (SEM) images of silicon nanotubes fabricated from 1 µm polystyrene nanospheres with $d_o=730\pm7$ nm, and sidewall width ($w=(d_o-d_i)/2$) from $105\pm5$ nm to $290\pm7$ nm (scale bar: 400 nm).

FIG. 4C illustrate top-view SEM images of silicon nanotubes fabricated from 2 µm polystyrene (PS) nanospheres with $d_o=1340\pm12$ nm, and w from $120\pm12$ nm to $420\pm8$ nm (scale bar: 400 nm).

FIG. 4D illustrates a graph of PS sphere diameter as a function of PS sphere etch time for oxygen plasma reactive ion etching (RIE) time dependent size reduction of polystyrene nanoparticles (1 and 2 µm PS spheres).

FIG. 4E illustrates a graph of sidewall thickness (w) as a function of silicon etch time showing oxygen plasma RIE time dependent w corresponding to FIGS. 3B, 3C with $d_o=1340\pm12$ nm.

FIG. 4F is a schematic illustration of independent control of $h_o$ and $h_i$. From left to right, $h_o>h_i$, $h_o=h_i$, and $h_o<h_i$. Below each illustration are SEM images of corresponding silicon nanotube cross-sections prepared by focused ion beam milling with Pt (white part) as a protection layer (scale bar: 500 nm).

FIG. 4G illustrates a graph of silicon etching depth as a function of silicon etch time. The graph illustrates the DRIE time dependence of $h_o$ and $h_i$. Silicon etch rates were 0.66 µm/min for $h_o$ and 0.50 µm/min (0-3 min)/0.18 µm/min (3-8 min) for $h_i$, respectively.

FIGS. 5A-5D schematically illustrates how multiple-patterning nanosphere lithography is used to fabricate a variety of periodic hierarchical nanostructures including: silicon nanotowers with two levels (FIG. 5A), three levels (FIG. 5B), and four levels (FIG. 5C) with tunable heights (including negative heights for selected levels) and diameters for each level (FIG. 5D). Corresponding SEM images of the respective nanostructures is seen below each schematic representation in FIGS. 5A-5D.

FIGS. 5E-5H schematically illustrate configurable concentric plasmonic Au nanorings/nanodisks on silicon substrates (solid/hollow two-level nanotowers (FIGS. 5E-5G)), $SiO_2$ nanostructures (two-level nanotowers—FIG. 5H). Corresponding SEM images of the respective nanostructures is seen below each schematic representation in FIGS. 5E-5H.

FIG. 5I schematically illustrates an Au coated, flexible polydimethylsiloxane (PDMS) substrate that has been negatively replicated with hollow nanotowers. A corresponding SEM image of the Au/PDMS substrate is shown below the schematic representation.

FIG. 5J is the reflection visible-infrared spectra of Au/Si nanotowers with different dimensions (sample (i) and sample (ii) illustrated on right). Solid lines are the experiment results and dotted lines are corresponding simulation results. (Sample sizes in nm, sample i: p=900, $d_1=530$, $h_1=300$, $d_2=320$, $h_2=230$, and $t_{Au}=50$; Sample ii: p=900, $d_1=570$, $h_1=230$, $d_2=320$, $h_2=300$, and $t_{Au}=50$). Note that, the spectra (500 to 6000 nm) were collected using two different spectrometers with different ranges (500 to 2500 nm and 2500 to 6000 nm respectively) and stitched together at 2500 nm (vertical dashed line) for comparison to simulations.

FIG. 6A is an exemplary scanning electron microscope (SEM) image of close-packed 1 µm polystyrene spheres in micro-scale.

FIG. 6B is a photograph of silicon wafers fully covered by close-packed 1 µm polystyrene spheres. The reflected colors indicate the well-ordered configuration of the polystyrene microspheres.

FIG. 6C illustrates the corresponding fast Fourier transform (FFT) of the SEM image of FIG. 6A.

DETAILED DESCRIPTION OF THE ILLUSTRATED EMBODIMENTS

Figure 1A:
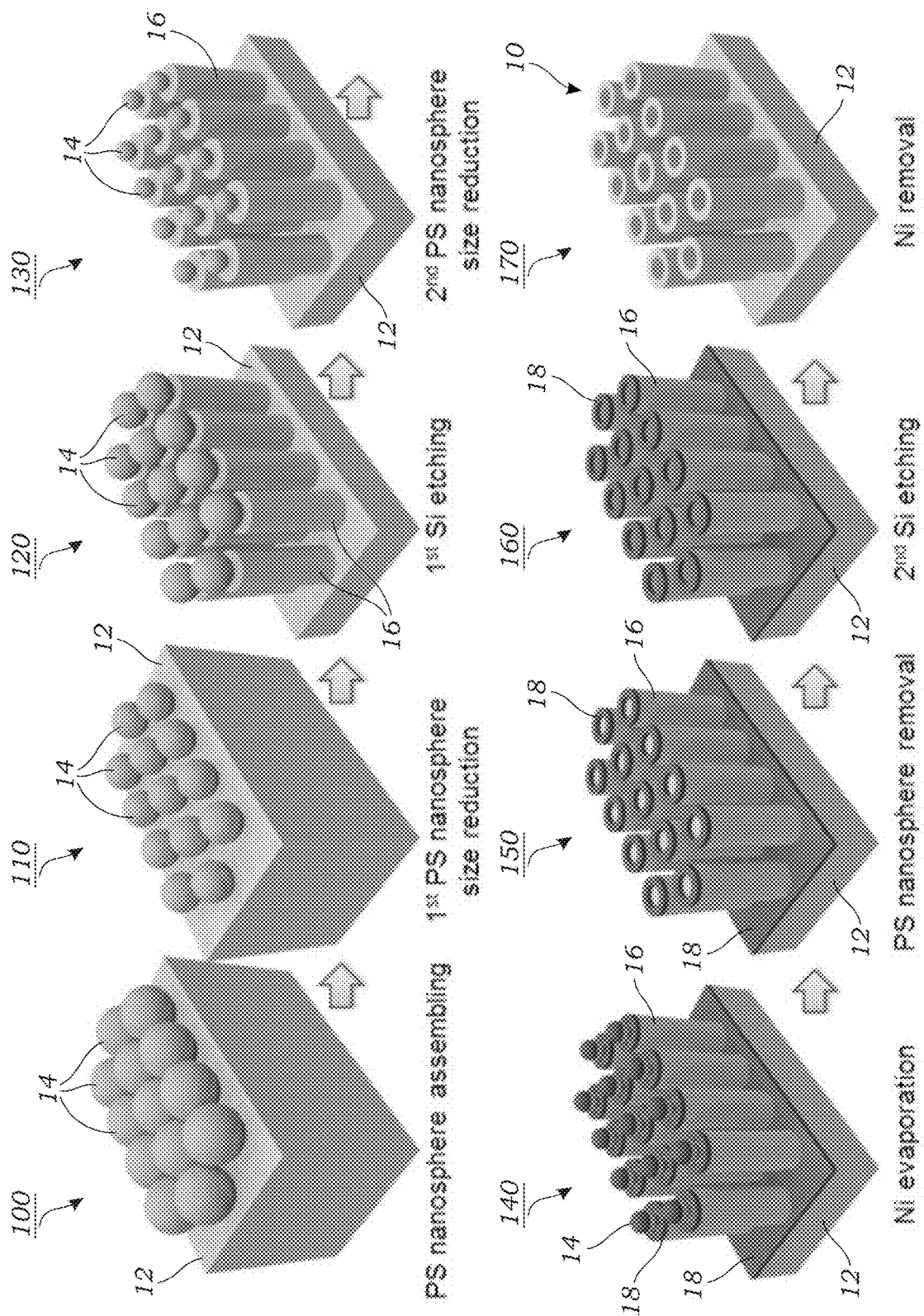
FIG. 1A is a schematic illustration of an embodiment of the MP-NSL method. In this embodiment a series of steps or operations is performed. Step 1: a monolayer of close-packed spherical particles (e.g., polystyrene (PS) nanospheres) is formed at a water/air interface, then transferred onto a wafer such as silicon. The size and spacing between the nanospheres defines the ultimate pitch (p) of the array of silicon nanostructures. Step 2: oxygen plasma reactive ion etching (RIE) reduces the sphere size and defines the outer diameters ($d_o$) for silicon nanotube structures. Step 3: deep reactive ion etching (DRIE) etches silicon into nanopillars by using the nanospheres as masks. The outer heights ($h_o$) of silicon nanotubes are controlled by the etch time. Step 4: a second oxygen plasma RIE further reduces the sizes of polymer nanoparticles and defines the inner diameters ($d_i$) of silicon nanotubes. Step 5: Nickel (Ni) is deposited to form Ni-based nanorings on the silicon nanopillars and it functions as a DRIE mask. Step 6: polystyrene nanoparticles are removed by 10 min oxygen plasma etching to expose the center part of the silicon nanopillars. Step 7: DRIE is performed again to etch holes and to define the hole depth ($h_i$). Step 8: Nickel is removed by HCl and pristine silicon nanotube arrays are obtained.

The multiple-patterning nanosphere lithography (MP-NSL) methods described herein are manufacturing and/or fabrication processes that achieve wafer-scale fabrication of a multiplicity of periodic nanostructures 10 while enabling independent control over all structural dimensions during fabrication including heights, pitches, number of tiers or layers, angles, inner/outer diameters, and hole-depths for tubular or hole-containing structures. The methods described herein may be used to create any number of nanostructures 10 including, for example, needles, spears, tubes, pyramids, pillars, and towers. In some embodiments, such as towers, multi-layered nanostructures 10 may be formed having a plurality of discrete layers or tiers that form the final structure. The periodic nanostructures 10 are formed in a substrate 12 such as, for example, a silicon (Si) wafer however it should be appreciated that other similar materials may be used such as, for instance, gallium arsenide or other semiconductor materials. In some embodiments, the silicon-based nanostructures 10 may be oxidized into silicon dioxide ($SiO_2$) by heating the formed nanostructures 10 in an oxygen-containing environment.

In some embodiments, the fabricated nanostructures 10 may be deposited or coated with a metal. The metal may cover all or portions of the fabricated nanostructures 10. For example, in some embodiments where the plasmonic properties of the periodic nanostructures 10 is of interest, a metal such as gold, silver, or aluminum may be deposited or coated onto one or more surfaces of the nanostructure 10. This may be accomplished by conventional metal deposition techniques known in semiconductor processing (e.g., chemical vapor deposition, e-beam deposition). In some embodiments, the fabricated nanostructures 10 may be made or rendered porous.

In some embodiments, the fabricated nanostructures 10 may be used as a template structure that is used to form a negative or relief structure in another substrate or material. For example, the fabricated nanostructures 10 may be used as a stamp or mold that is mechanically contacted with another substrate or material (e.g., soft material) to form relief structures. Alternatively, a liquid or semi-liquid material may be disposed on the fabricated nanostructures 10 and then cured or crosslinked to create the negative or relief structures formed therein. For example, polydimethylsiloxane (PDMS) may be poured or loaded over a plurality of fabricated nanostructures 10 and then cured to create relief structures based on the fabricated nanostructures 10.

In some embodiments, the fabricated nanostructures 10 may be solid. In other embodiments, portions of the fabricated nanostructures 10 may have voids or inner recesses created in the fabrication process. For example, nanotube-type nanostructures 10 may be formed with an inner void or recess that defines the tubular nature of the nanostructures 10. This inner void or recess may be tuned to adjust the wall thickness of the nanotube nanostructure 10 as well as the height or depth of the void or recess.

The fabricated nanostructures 10 described herein may, in some embodiments, remain fixed to the substrate 12 on which they were formed. For example, the fabricated nanostructures 10 may project as an array from the substrate 12. In other embodiments the fabricated nanostructures 10 may be removed or liberated form the substrate 12 on which they were formed. For example, the fabricated nanostructures 10 may be mechanically removed from the substrate 12 by scraping the surface or through mechanical agitation/disruption. The fabricated nanostructures 10 may also be liberated by removal of the substrate 12 material through one or more etching operations.

FIG. 1A schematically illustrates one embodiment of a process used to manufacture or fabricate nanostructures 10 in the form of periodic nanotubes 10 by MP-NSL. In this method, a substrate 12 is provided, which in one preferred embodiment is a silicon substrate 12 (e.g., silicon wafer). In the first operation, a monolayer of spherical particles 14 is assembled atop the silicon substrate 12. As one example, polystyrene beads are used for the spherical particles 14, although different polymers or materials that are compatible with the etching/passivation processes described herein may also be used. In one embodiment, the spherical particles 14 are first drop cast onto a slide and then transferred to the silicon substrate 12. In this process, a monolayer of spherical particles 14 is assembled by distributing an aqueous dispersion of the spherical particles 14 drop cast onto a tilted glass slide such as described in Chen et al., Nanosphere Lithography, ACS Nano 2015, 9, 6031-6040, which is incorporated herein by reference. The monolayer is then transferred to a silicon substrate 12 underneath the water/air interface by gently removing the liquid. Various starting diameters of the spherical particles 14 may be used. For example, the spherical particles 14 may include polystyrene nanospheres with diameters of tens of hundreds of nanometers to diameters up to several microns. As explained herein, the pitch of the array of fabricated nanostructures 10 is determined by the original diameters of the spherical particles 14 used as a template.

As seen in the first operation 100 of FIG. 1A, the spherical particles 14 (e.g., polystyrene beads) are closely packed together atop the substrate 12 (assembly of polystyrene (PS) nanospheres), which in this embodiment is a silicon substrate. In the next operation 110, the spherical particles 14 are then subject to a size reduction operation via oxygen plasma reactive ion etching (RIE) to define the outer diameter ($d_o$) of the nanostructures 10 (in this case silicon nanotubes) as seen in FIG. 4A. By controlling the oxygen plasma RIE time, one can tailor the diameter of the spherical particles 14 precisely without changing the pitch of the resulting nanostructures 10. After the spherical particles 14 have been reduced in size, the spherical particles 14 are coupled to the silicon substrate 12 after the initial oxygen RIE step by heating briefly to 120° C. for ~30 sec. Next, as seen in operation 120, deep reactive ion etching (DRIE) is used to etch the silicon substrate 12 to form the silicon pillars 16. The outer heights ($h_o$) and inner hole-depths ($h_i$) of the nanostructures 10 (see FIG. 4F) are controlled by the DRIE time. A Bosch process, which consists of multiple cycles of passivation and etching is used to achieve high-aspect-ratio pillars 16. With reference to FIG. 1A, after the silicon pillars 16 (also referred to herein as nanopillars) have been formed, the particles 14 undergo a second round of size reduction via oxygen plasma RIE as seen in operation 130.

Next, in operation 140, a thin layer of metal 18 (in this example nickel (Ni)) is deposited via electron-beam evaporation along the exposed silicon at the tops of the pillars 16 to avoid undesired etching. The metal mask layer 18 atop the pillars 16 forms an anulus at the outer periphery of the pillars 16 (that is not covered by the remaining size of the particles 14). Nickel was selected here as the as the metal masking material as it is highly resistant to silicon dry etching processes. The thin nickel layer 18, typically having a thickness of about 20 nm, forms a ring or annulus shape at the top of the pillars 16 and also covers the bottom surface of the silicon substrate 12. In operation 150, the polymer particles 14 are removed. This may be done by additional oxygen plasma RIE operation or by mechanical means. For example, tape may be used to remove the remaining particles 14 to expose the centers of the silicon pillars 16 for etching. The inner-diameters of the annular metal layer 18 define the inner diameter ($d_i$) and sidewall thickness ($w = d_o - d_i$) of the nanostructures 10 (e.g., nanotubes) as seen in FIG. 4A generated after an additional round of DRIE to etch the centers of the silicon pillars as seen in operation 160. The nickel metal layer 18 on the top of the nanostructures 10 and the nickel on the substrate 12 is then removed via a chemical etch treatment (e.g., 5% HCl) to obtain the final array of nanostructures 10 as seen in operation 170.

Figure 2:
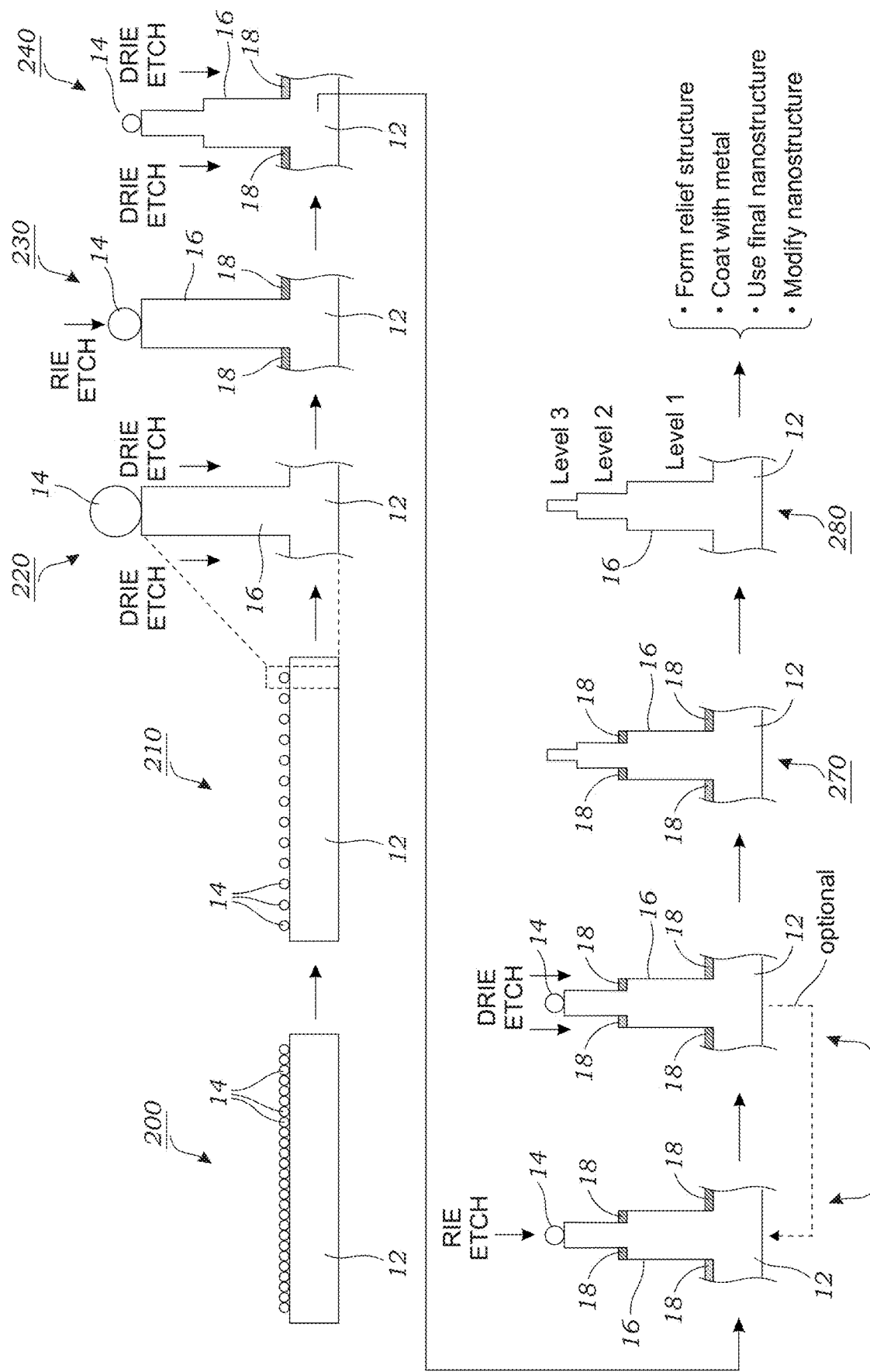
FIG. 2 schematically illustrates a process of fabricating multi-level tower arrays on a substrate according to one embodiment.
Figures 7A, 7B:
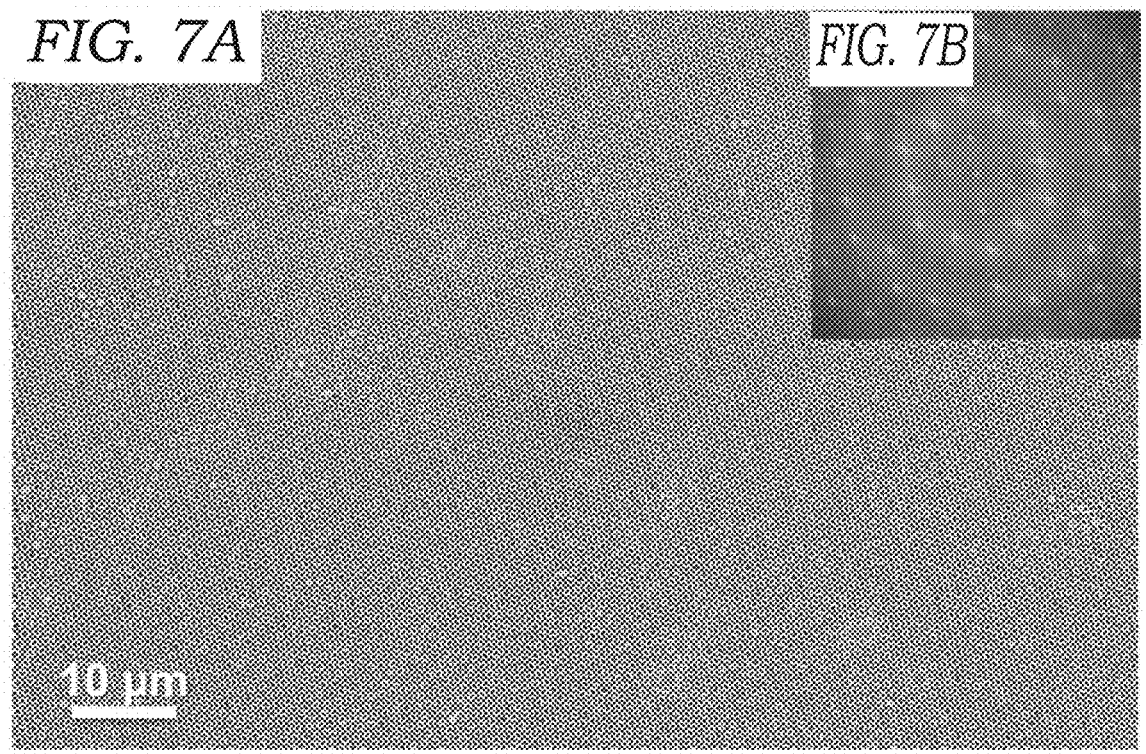
FIG. 7A illustrates an exemplary scanning electron microscope (SEM) image of a large area of the silicon nanotube arrays.
FIG. 7B is the corresponding fast Fourier transform (FFT) of the image of FIG. 6A.
Figure 7C:
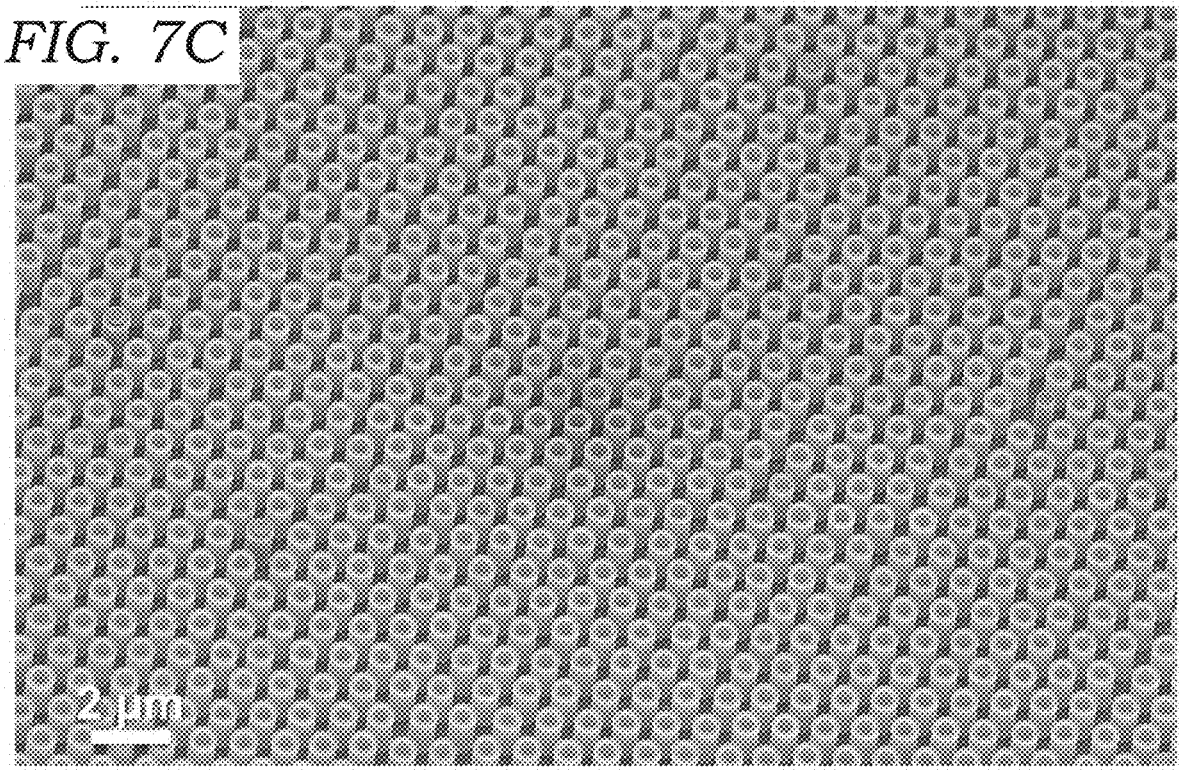
FIG. 7C is a typical SEM image of large-area silicon nanotube arrays recorded at a tilt of 30°.

FIG. 2 illustrates an alternative sequence of operations or steps that are used to create a different type of nanostructure 10, namely multi-level tower arrays on a substrate 12. In this embodiment, as seen in operation 200, a monolayer of packed nanometer- or micrometer-sized spherical particles 14 is assembled onto a substrate 12 (e.g., silicon substrate as described in the prior embodiment). Next, in operation 210, the size of the packed spherical particles 14 on the substrate 12 is then reduced by etching (e.g., oxygen plasma RIE). Next, as seen in operation 220, the substrate 12 with the reduced size particles 14 is then subject to deep reactive ion etching (DRIE) to generate an array of pillars 16 on the surface of the substrate 12. With reference to operation 230 of FIG. 2, a metal mask layer 18 is deposited on the substrate 12 (e.g., metal layer such as Ni). The size of the particles 14 is then reduced by an additional etching operation. Next, with reference to operation 240, another round of DRIE forms the second layer or tier of the multi-layer tower 10. In operation 250 as illustrated in FIG. 2, the size of the particles 14 is reduced again by another RIE etching operation and the second tier or layer is protected with a metal mask layer 18. Next, with reference to operation 260 in FIG. 2, another round of DRIE etching forms the third layer or tier of the multi-layer tower nanostructure 10. Depending on the desired number of tiers or layers of the multi-layer tower nanostructure 10, operations 250 and 260 are repeated to create any number of tiers or layers (illustrated by dashed arrow in FIG. 2). With reference to operation 270 of FIG. 2, the remaining particles 14 can be removed either through etching or mechanical means (e.g., using a tape as described herein). The metal mask layer 18 (e.g., Ni) may be removed using a chemical etchant such as that described in the prior embodiment as seen in operation 280.

The final multi-layer tower nanostructure 10 may be then be used directly. The final multi-layer tower nanostructure 10 may also be used as a stamp or mold to create a relief/negative structure as explained herein. The multi-layer tower nanostructure 10 may be coated with a metal (e.g., gold, silver, aluminum) to increase plasmonic properties of the multi-layer tower nanostructure 10. The final multi-layer tower nanostructure 10 may also be modified in some respects. For example, in some embodiments, the silicon may be transformed into silicon dioxide ($SiO_2$) by heating the nanostructure 10 in an oxygen-containing environment. In other embodiments, the multi-level tower structure 10 may be made or rendered porous by etching the substrate material (e.g., by using a wet etch operation). In still other embodiments, the multi-layer tower nanostructure 10 may incorporate a void or recess may be formed in the multi-layer tower nanostructure 10. This would be accomplished by forming an annular metal mask layer 18 such as that illustrated in FIG. 1A in the top or uppermost tier using the particle 14 as a resist and then removing the particle 14 followed by etching of the substrate 12 material. The annular metal mask layer 18 (and any other metal layer) can then be removed by chemical etching as described herein.

Experimental Results

Figure 8:
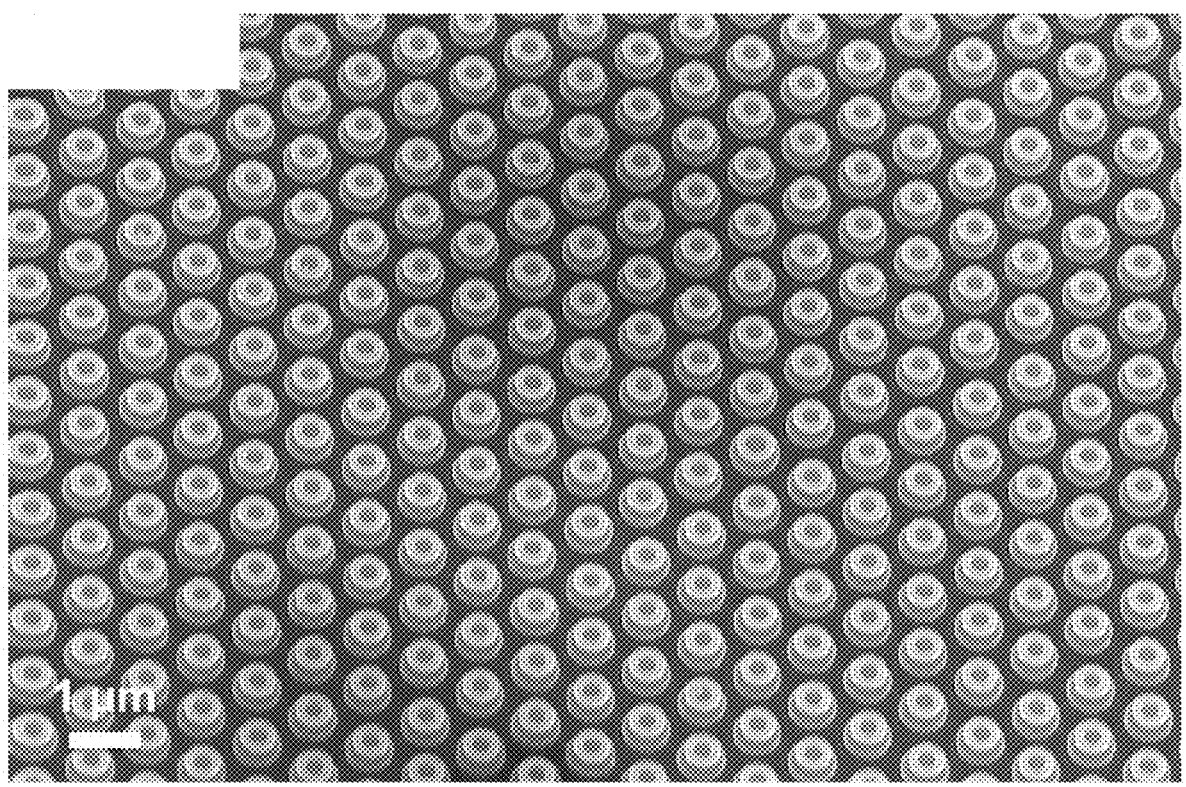
FIG. 8 is an exemplary scanning electron microscope (SEM) image of a large area of silicon nanostructures recorded at a tilt of 30°.

Periodic silicon-based nanostructures 10 (i.e., nanotubes) were formed by MP-NSL using the fabrication sequence of FIG. 1A. Associated scanning electron microscopy (SEM) images of the substrate 12 and particles 14 from key operations is illustrated in FIGS. 1B-G. A variety of silicon-based (nanotube) nanostructure 10 arrays were fabricated with different parameters: pitches (400 nm to 2 µm), outer heights (100 nm to 6 µm), inner heights (100 nm to 2 µm), outer diameters (220 nm to 1.3 µm), inner diameters (130 to 1050 nm), and tube thicknesses (sub-50 to 500 nm). Representative SEM images of a selection of silicon nanotubes 10 are depicted in FIGS. 3A-3H. In addition, SEM images of large area, well-ordered nanosphere particle 14 templates and silicon nanotube arrays with the corresponding Fourier transform patterns are shown in FIGS. 6A-6C and 7A-7C. FIG. 8 illustrates an SEM image of a large area of silicon nanostructures 10 recorded at a tilt of 30°.

The template for MP-NSL relies on a monolayer of polystyrene nanospheres used as the spherical particles 14, which is assembled by slowly distributing an aqueous dispersion of the nanospheres drop cast onto a tilted glass slide. The monolayer was then transferred to a 2 cm×2 cm silicon substrate 12 underneath the water/air interface by gently removing the liquid. Polystyrene spherical particles 14 with diameters of 400 nm, 600 nm, 900 nm, 1 µm, and 2 µm were chosen as examples but it should be appreciated that other diameters may be used (e.g., particles with nanometer- or micrometer-sized diameters). The assembly of the spherical template is highly scalable such that one can easily reach the wafer scale manually and can conceivably reach the square meter scale using automated dispensing systems for dispensing spherical particles 14.

Figure 9:
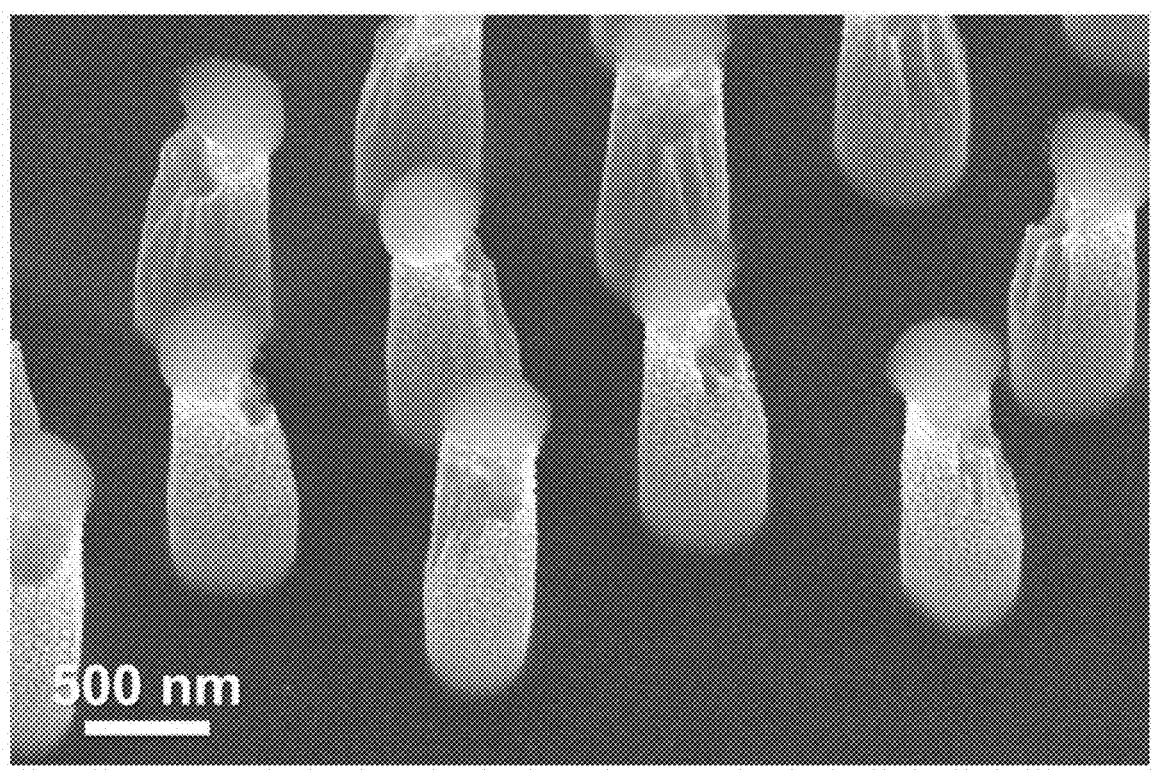
FIG. 9 is an exemplary scanning electron microscope image of polystyrene nanospheres with oblate ellipsoid shapes after oxygen plasma reactive ion etching.

Next, the diameters of the spherical particles 14 (polystyrene nanospheres) are defined via oxygen plasma reactive ion etching (RIE) to define the outer diameter ($d_o$) of the nanotube nanostructure 10. By controlling the oxygen plasma RIE time, one can tailor the spherical particle 14 diameter precisely without changing the pitch. For instance, a 4-min oxygen plasma RIE can uniformly and precisely etch close-packed polystyrene spheres 14 of 1 µm diameter into ~820 nm diameter spherical particles 14 with identical spacings of ~180 nm, FIG. 1C. As illustrated in FIGS. 3A-3H and Table 1 below, the oxygen plasma RIE time and the diameters of polystyrene nanospheres used as the spherical particles 14 correlate closely and the results are highly reproducible. The diameters of the spherical particles 14 notably decrease faster with increasing oxygen plasma RIE time due to the polymer nanoparticles becoming flatter with a more oblate ellipsoid shape (FIG. 9).

TABLE 1

| Pitch = 1 µm | | Pitch = 2 µm | |
| --- | --- | --- | --- |
| Etch time | $d_o$ | Etch time | $d_o$ |
| 2.5 min | 910 ± 4 nm | 4 min | 1860 ± 9 nm |
| 3 min | 900 ± 4 nm | 7 min | 1630 ± 8 nm |
| 3.5 min | 860 ± 6 nm | 10 min | 1350 ± 10 nm |
| 4 min | 820 ± 5 nm | 13 min | 1160 ± 9 nm |
| 5 min | 760 ± 7 nm | 15 min | 800 ± 10 nm |
| 6 min | 610 ± 7 nm | 16 min | 740 ± 8 nm |
| 7 min | 480 ± 5 nm | | |
| 8 min | 330 ± 6 nm | | |

Figure 10:
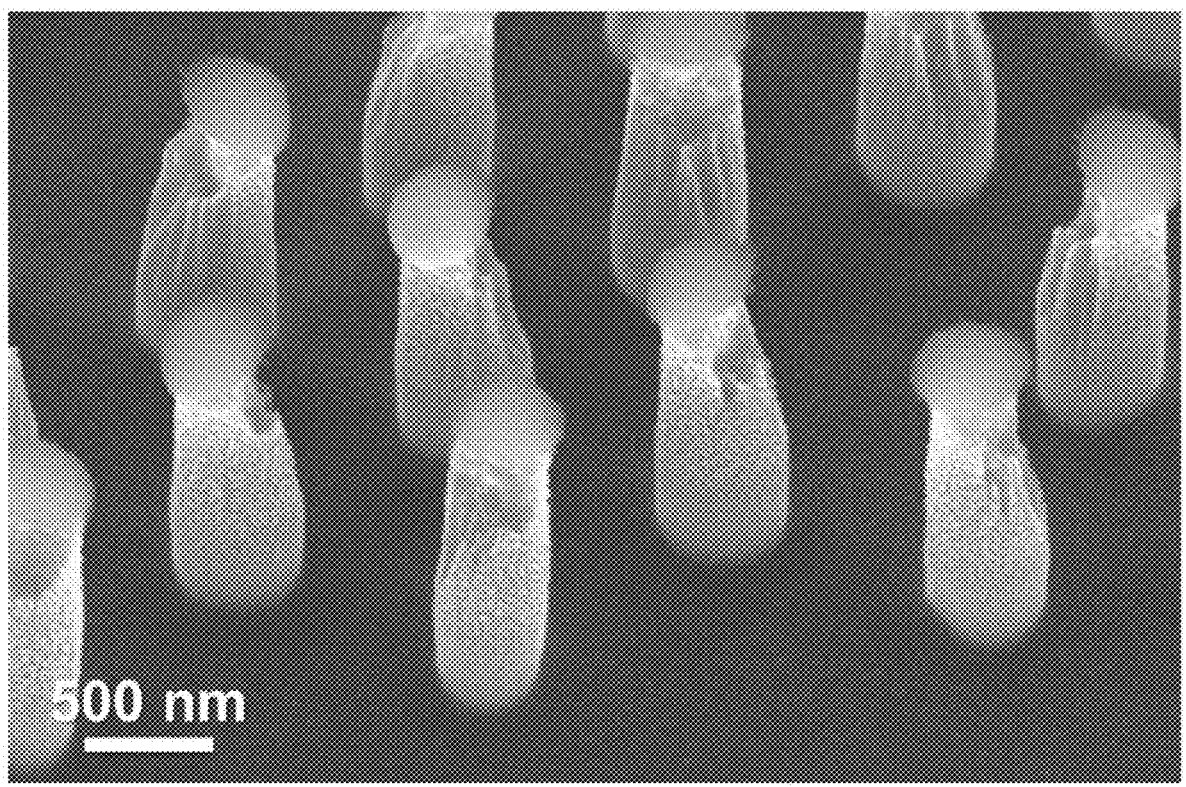
FIG. 10 illustrates a SEM image of how enhancing the adhesion between the polystyrene nanospheres and the underlying silicon substrate before dry etching helps to prevent tilting of the etched polymer nanoparticles, which could lead to asymmetries in the final pillar/nanotube arrays without heating.

It is important to note that enhancing the adhesion between the spherical particles 14 (polystyrene nanospheres) and the underlying silicon substrate 12 before dry etching helps to prevent the random tilting of the etched spherical particles 14, which could lead to asymmetries in the final pillar/nanotube arrays (FIG. 10). For example, the polystyrene nanospheres 14 are coupled to the silicon substrate 12 after the initial oxygen RIE step by heating briefly to 120° C. for ~30 sec. This treatment does not result in noticeable lateral deformation, but appears to fix the etched polymer nanoparticles 14 to prevent moving or tilting during the subsequent processes.

Figure 11A:
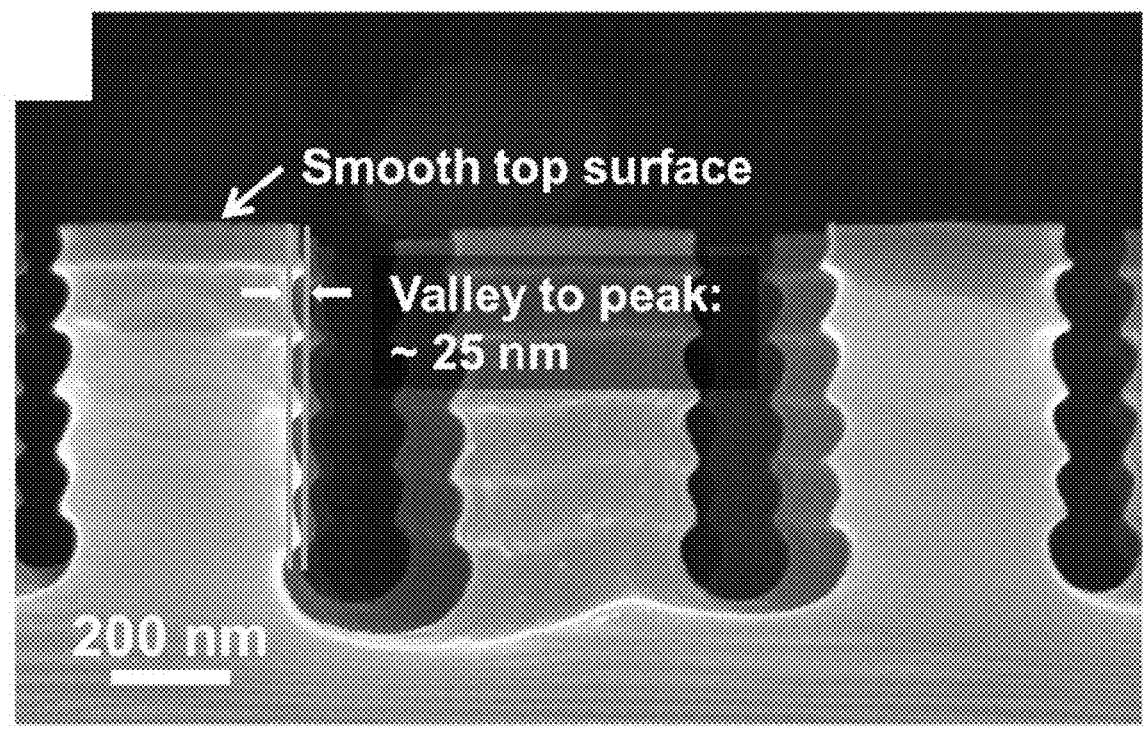
FIG. 11A illustrates a high-resolution scanning electron microscope (SEM) image of silicon nanopillars made via the Bosch process. The top surfaces of the silicon nanopillars are smooth. The average distance between valleys and peaks on the sidewall of a silicon nanopillar is ~25 nm.
Figure 12:
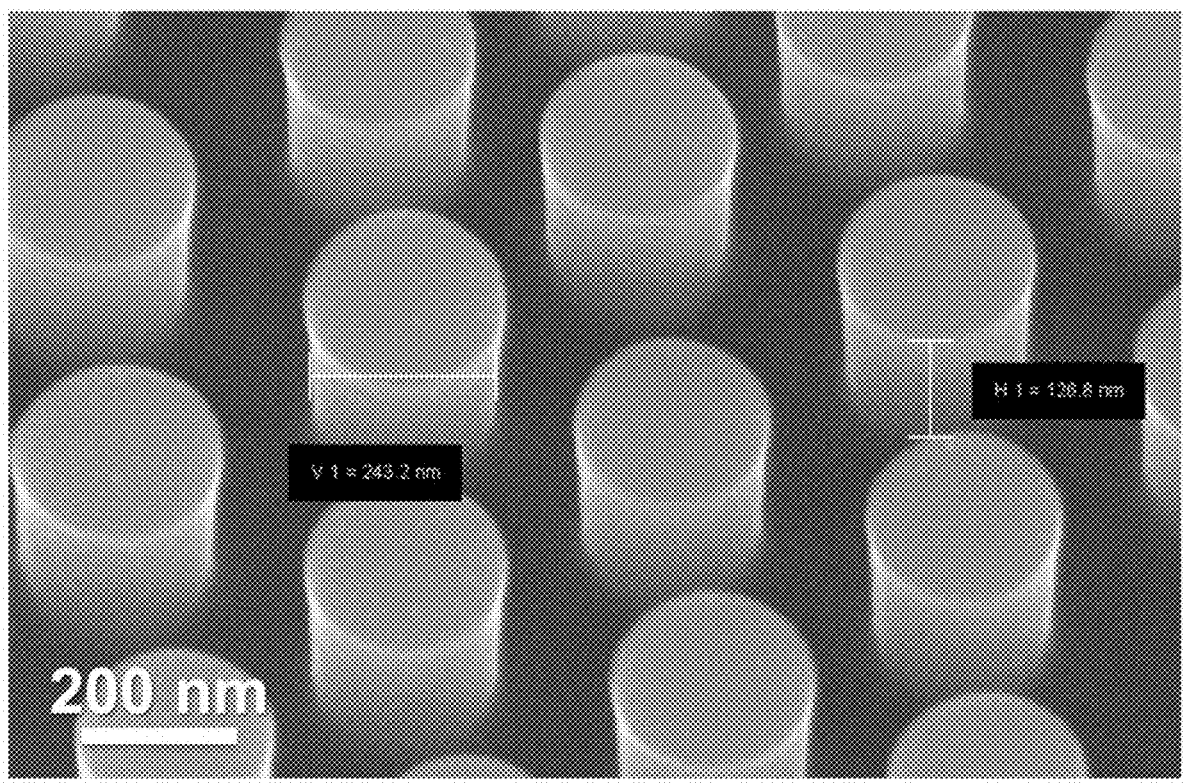
FIG. 12 is a scanning electron microscope (SEM) image of periodic silicon nanopillars with smooth sidewalls fabricated by single-step deep reactive ion etching.

Methods for etching silicon involve either wet-etching strategies such as metal-assisted chemical etching or dry-etching approaches such as reactive ion etching (RIE). Here, a dry etching technique, specifically deep reactive ion etching (DRIE), was chosen due to its capability for anisotropic etching, high reproducibility, and non-toxicity. The outer heights ($h_o$) and inner hole-depths ($h_i$) of the silicon nanotubes 10 (FIG. 4F) that are formed are controlled by the DRIE time. Specifically, DRIE via the Bosch process, which consists of multiple cycles of passivation and etching, was applied to achieve high-aspect-ratio pillars 16. The alternating cycles of passivation and etching in the Bosch process protects the sidewalls of nanostructures 10 from being etched laterally over large depths. FIG. 1D illustrates a typical array of high-aspect-ratio silicon nanopillars produced via MP-NSL with polystyrene nanoparticles 14 sitting on their tops ($h_o$=2000 nm). The Bosch process typically results in periodic "ripples" on the sidewalls as shown in FIG. 3, which is called the "scalloping effect". As shown in the high-resolution SEM image in FIG. 11A, the thickness of the "ripple" is typically ~25 nm. Note that the top surfaces of the silicon nanopillars 16 remain smooth, as they were protected by the polystyrene bead template during etching. However, the "scalloping effect" can be minimized and/or eliminated in MP-NSL by using an optimized Bosch process or cryogenic-DRIE to generate silicon nanostructures with smooth sidewalls. Low-aspect-ratio silicon nanostructures 10 with smooth sidewalls were achieved straightforwardly via single-step DRIE, which uses $C_4F_8$ and $SF_6$ simultaneously as the etching and passivation gases (FIGS. 3G-H and 12).

After the fabrication of Si-based pillars 16, a second oxygen plasma RIE was applied to reduce the size of the polystyrene nanoparticles 14 sitting on top of the pillars 16 (FIG. 1D). The reduced size particles 14 remain centered on the pillars 16 and serve as templates for subsequent etching treatments to obtain the nanotubes 10. Next, a thin layer of nickel (Ni) was deposited as a metal masking layer 18 via electron-beam evaporation along the exposed silicon at the tops of the nanopillars 16 to avoid undesired etching. Nickel was selected as the material for the metal masking layer 18 as it is highly resistant to silicon dry etching processes. The thin nickel metal masking layer 18, typically 20 nm, forms nickel nanorings at the top of the nanopillars 16 and also covers the bottom surface of the silicon substrate as seen in FIG. 1E. The polymer-based particles 14 are subsequently removed with tape to expose the centers of the silicon pillars 16 for etching as seen in FIG. 1F. The inner-diameters of the Ni-based nanorings define the inner diameter ($d_i$) and sidewall thickness ($w=d_o-d_i$) of nanotubes 10 generated after a second round of DRIE. The nickel is then removed via a chemical etch treatment (e.g., 5% HCl) to obtain the final silicon nanotube 10 arrays (FIG. 1G).

As schematically illustrated in FIG. 4A, altering the time of the second oxygen plasma RIE step enables the inner diameter $d_i$ and thus the sidewall thickness w of the silicon nanotubes 10 to be tuned precisely. A series of silicon nanotubes 10 were fabricated by using 1 µm and 2 µm polystyrene spheres 14 as masks for MP-NSL. First silicon nanopillars 16 with diameters of 730±7 nm and 1340±12 nm were fabricated using the 1 µm and 2 µm polystyrene spheres masks, respectively. Then, the second oxygen plasma RIE time was varied to control the diameter of the polystyrene nanoparticles 14 on top of the silicon nanopillars 16 and applied a second DRIE treatment as described above to generate ordered silicon nanotubes 10 with different sidewall thicknesses (FIGS. 4B-4E). As shown in the Tables 1 and 2 (below): for silicon nanopillars 16 with $d_o$=720 nm, a second oxygen plasma RIE time of 3, 3.25, 3.5, 4, and 4.5 min, resulted in sidewall thicknesses of 105±5, 120±4, 150±5, 200±5, and 290±7 nm, respectively, while for 1340±12 nm diameter silicon nanopillars 16, oxygen plasma RIE times of 3-7 min resulted sidewall thicknesses ranging from 120±12 to 420±8 nm. Even smaller sidewall thickness, such as 45±2, 80±2, 100±3 nm, can be achieved by further decreasing the RIE time difference as seen in FIGS. 3F-3H. Such high accuracy control over the size of the spherical particles 14 is comparable to many electron- or ion-beam-based nanolithography techniques.

TABLE 2

| Pitch = 1 μm | | Pitch = 2 μm | |
|---|---|---|---|
| Etch time | w | Etch time | w |
| 3 min | 105 ± 5 nm | 3 min | 120 ± 12 nm |
| 3.25 min | 120 ± 5 nm | 4 min | 180 ± 7 nm |
| 3.5 min | 150 ± 5 nm | 5 min | 250 ± 8 nm |
| 4 min | 200 ± 9 nm | 5.5 min | 300 ± 8 nm |
| 4.5 min | 290 ± 7 nm | 6 min | 340 ± 9 nm |
| | | 7 min | 420 ± 8 nm |

The outer height ($h_o$) and inner hole-depth ($h_i$) of the silicon nanotubes 10 can be controlled independently by varying their respective DRIE times. The SEM cross-sectional images shown in FIG. 4F illustrate three representative silicon nanotube 10 arrays with different $h_o/h_i$ ratios, where from left to the right, $h_o > h_i$, $h_o = h_i$ (center), and $h_o < h_i$ (right). The DRIE etching rates used for each $h_o$ and $h_i$ are shown in FIG. 4G and Table 3 below. Specifically, an etch rate of 0.66 μm/min was used for $h_o$ while rates of 0.50 μm/min (0-3 min) and 0.18 μm/min (3-8 min) were used for $h_i$. A slower etch rate is observed for $h_i$, which is known as "RIE lag", i.e., the etching rate is related to the feature size, and the smaller the feature size, the lower the etching rate.

TABLE 3

| Etch time | $h_o$ | Etch time | $h_i$ |
|---|---|---|---|
| 1 min | 700 ± 25 nm | 2 min | 1100 ± 20 nm |
| 3 min | 2000 ± 28 nm | 3 min | 1500 ± 25 nm |
| 4 min | 2800 ± 32 nm | 4 min | 1700 ± 30 nm |
| 6 min | 4000 ± 38 nm | 6 min | 2000 ± 20 nm |
| 8 min | 5200 ± 50 nm | 8 min | 2410 ± 28 nm |

The robust and rapid fabrication of periodic 3D hierarchical nanostructures 10 is highly desirable for applications in nanophotonics, metamaterials, and biotechnology. Direct writing fabrication strategies based on two-photon, focused ion-beam, or electron-beam techniques have been developed to assemble 3D hierarchical micro-/nanostructures serially, but their widespread use within these areas has been precluded by low fabrication throughputs and a limited selection of compatible materials.

In contrast, the MP-NSL platform and method can serve as a high-throughput 3D nanolithographic tool to fabricate a variety of periodic 3D hierarchical nanostructures 10. For example, as shown in FIG. 5A, multi-level silicon nanopillars or "nanotowers" 10 with two, three, and four levels were fabricated by reducing the size of the particle 14 twice, three, and four times respectively with silicon etching applied after each size reduction as described in the context of the process of FIG. 2. A high-resolution SEM image (FIG. 11B) of multi-level silicon nanotowers 10 shows that all the levels or tiers have smooth surfaces. The smallest diameters at the apex of the silicon nanotowers 10 achieved are ~100 nm when using 900 nm nanospheres 14 as templates. The sidewall thickness (w) and height (h) of each level were controlled individually and precisely by varying the oxygen plasma RIE and DRIE times during processing (FIGS. 5A-5D). In principle, there is no limitation to the complexity of the nanostructures generated via MP-NSL. Potential applications for these multilevel nanotowers 10 include nanobarcodes and anti-reflective coatings. It is also possible to fabricate hollow silicon nanotowers 10 by integrating the etching processes used to generate silicon nanotubes 10 above. Moreover, MP-NSL can be applied to pattern similar nanotowers 10 with a wide range of materials, including $SiO_2$, and have used the nanostructures as a mold for soft materials, such as polydimethylsiloxane (PDMS) as seen in FIG. 5I.

Plasmonic nanostructures have attracted broad interest, including for potential applications ranging from biosensing and surface-enhanced spectroscopy to optical trapping. However, most plasmonic nanostructures fabricated by nanolithography have been largely two dimensional. The 3D nanostructures 10 described herein can further serve as templates for achieving periodic 3D hierarchical plasmonic nanostructures 10, important for engineering nanophotonics in 3D. For example, by evaporating a layer of a plasmonic metal (e.g., gold, silver, aluminum), onto an array of periodic $Si/SiO_2$/PDMS nanotowers 10, periodic 3D plasmonic nanostructures are obtained. The deposited metal layer may form metal annular rings (e.g., nanorings) or circular structures (e.g., nanodisks).

Figure 11B:
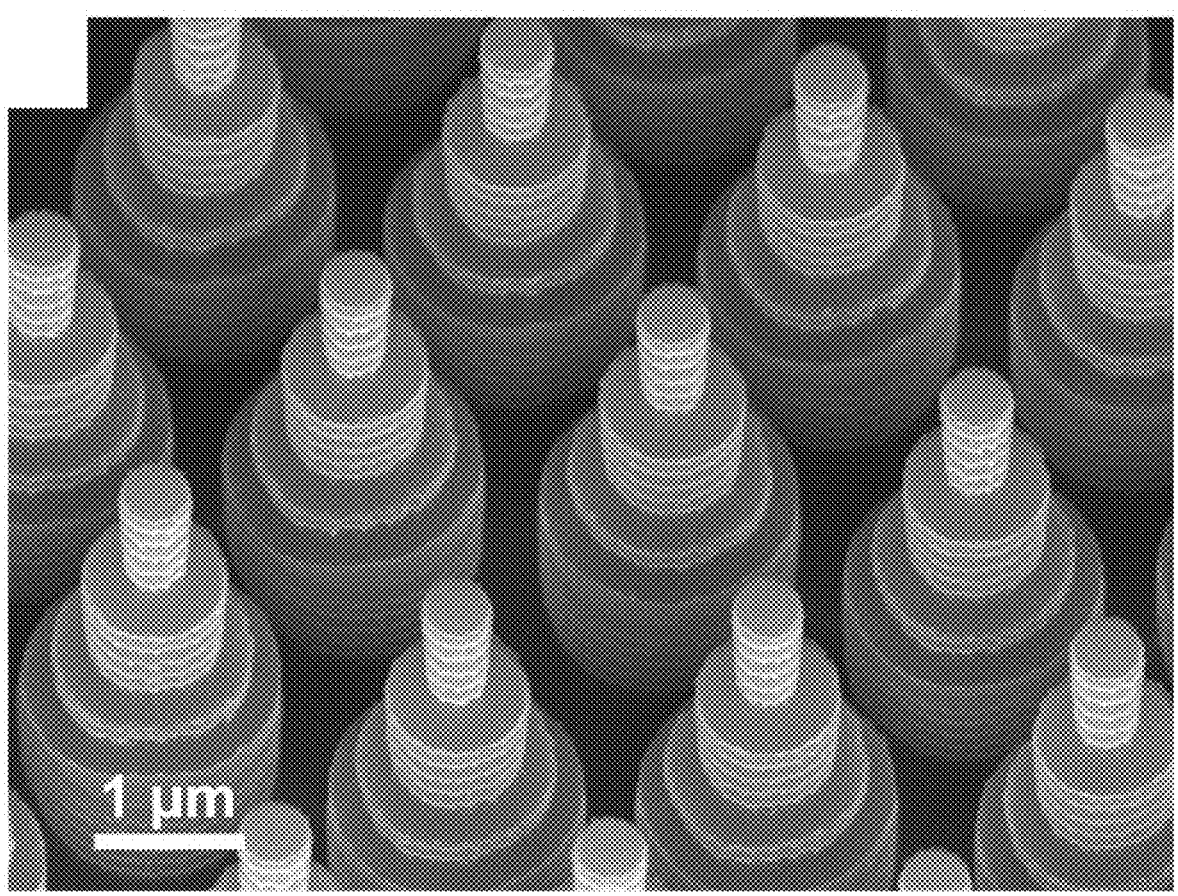
FIG. 11B is a high-resolution SEM image of four-level silicon nanotowers shows the smooth surfaces on the four levels.
Figure 13:
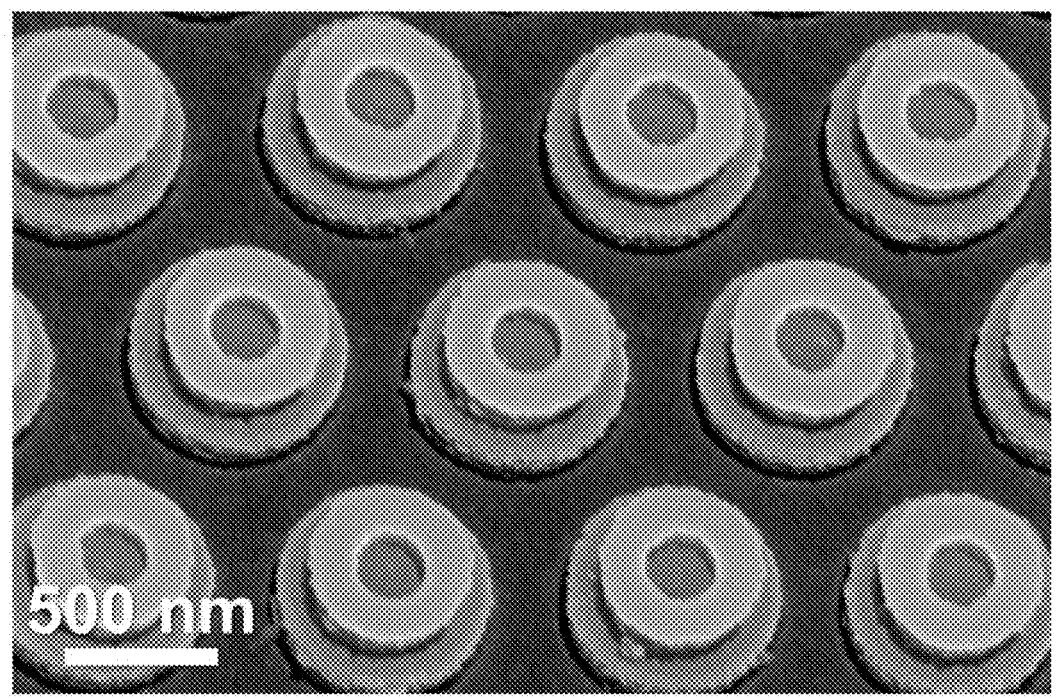
FIG. 13 is a high-resolution scanning electron microscope (SEM) image of 50 nm Au evaporated silicon nanostructures.
Figure 14A:
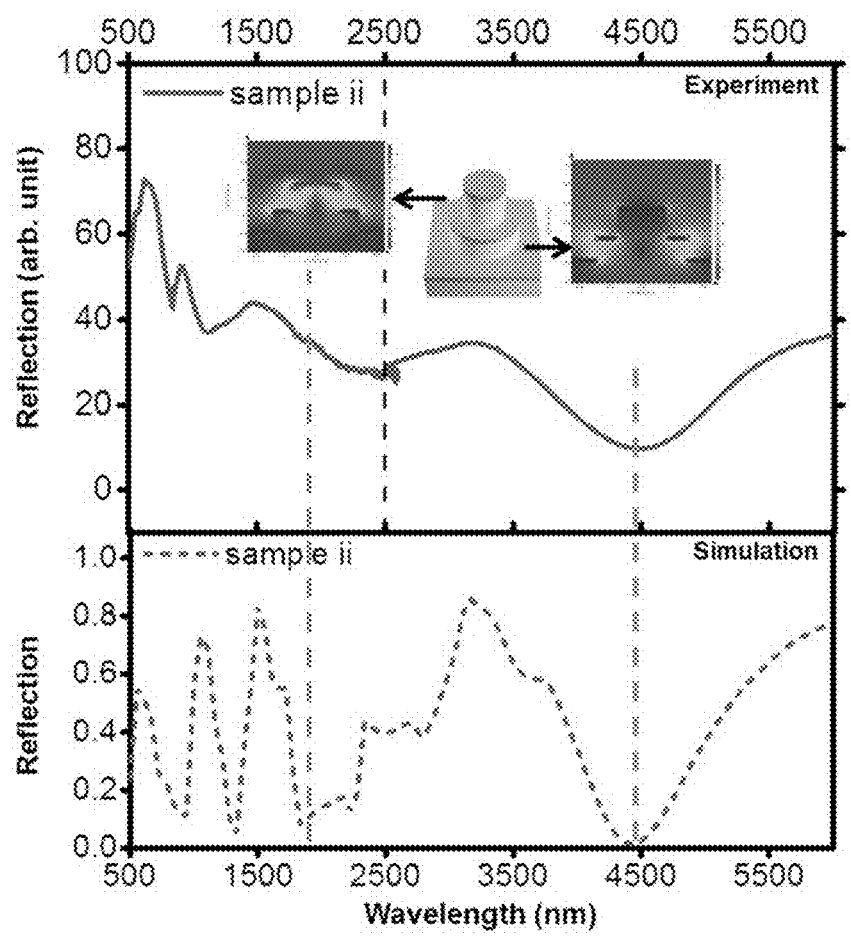
FIG. 14A illustrates the visible-infrared reflectance spectra of sample ii (experimental and simulation results). Insets: simulation results of the electric-field distribution of sample ii under photoexcitation (cross section).
Figure 14B:
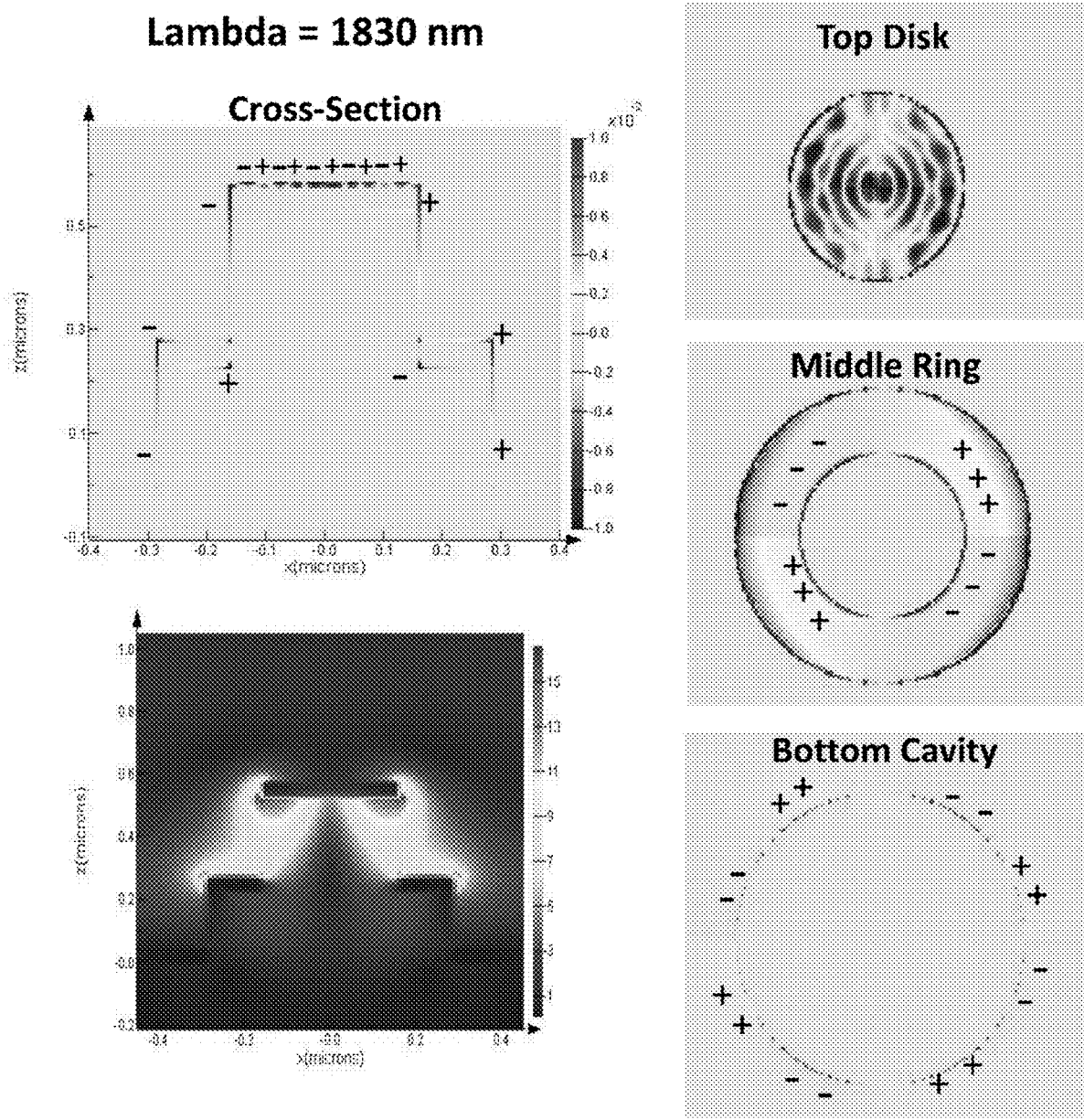
FIGS. 14B and 14C illustrate simulation of charge distributions on the Au surfaces on different layers of the sample ii at the two major dips (1830 nm and 4500 nm), from which one can see the 1830 nm mode is a combination of different multipole modes from the three layers; while the 4500 nm mode corresponds to the quadrupole modes of all three layers.
Figure 14C:
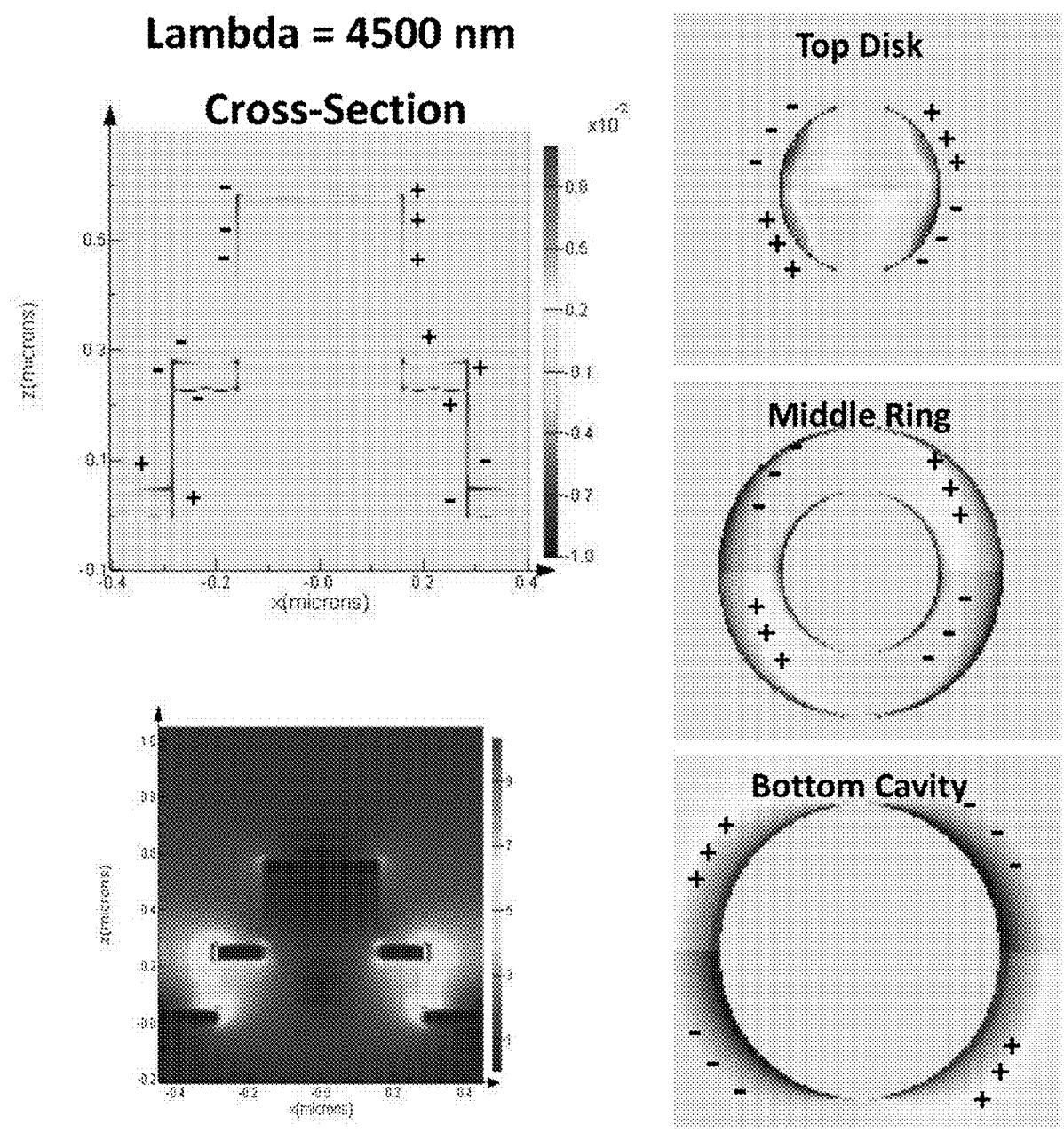

FIG. 5E-5H illustrates SEM images of gold-coated nanotowers 10. After gold evaporation, high-resolution SEM imaging reveals that each layer of the nanotower structures is smooth (FIGS. 11B and 13). The dimensions of the gold nanorings and gold nanodisks deposited atop the nanostructures 10 as well as the relative vertical distances between them are fully tunable with sub-20-nm-scale resolution, which enables one to design and to manipulate the optical properties of these periodic 3D plasmonic nanostructures 10. For example, 50 nm of gold was evaporated on two slightly different two-level silicon nanotowers 10 as shown in FIG. 5J (sample i and sample ii), and fully tunable 3D ring/disk plasmonic nanocavities were thereby fabricated. As shown in the reflection spectra of these vertically stacked plasmonic nanostructures 10, multiple resonant peaks ranged from visible to mid-IR were observed. The reflection spectra agree well with finite-difference-time-domain (FDTD) simulations (bottom). The simulation results indicate that multiple peaks and dips result from multimodal plasmonic resonances through hybridization between different plasmonic multipole modes of ring and disk cavities vertically (FDTD simulations of the electric-field and charge distributions are provided in FIGS. 14A-14C). Slight, intentional differences in geometry between the two plasmonic nanostructures 10 (sample i vs. sample ii) result in shifts in the reflection spectra due to changes of the resonance (FIG. 5J). Thus, MP-NSL is a tool to design and to fabricate optically tunable 3D plasmonic nanostructures 10.

The results establish that MP-NSL can be used as a 3D nanolithographic tool to achieve a variety of periodic 3D hierarchical nanostructures 10 that can be configured to enable applications in nanophotonics, optoelectronics, electronics, metamaterials, and biotechnology. This strategy is compatible with and could be integrated into micro/nanoscale device manufacturing to add components with functions enabled by rationally designed 3D nanostructures 10. Additionally, by using spherical particles 14 (e.g., beads) with different physicochemical properties and/or geometries, even greater control can be achieved.

Materials and Methods

Materials:

Prime quality 4" silicon (100) wafers (P/B, 1-10 ohm-cm resistivity) were purchased from University Wafer Inc. (Boston, Mass., USA). All spherical particles 14 (e.g., polystyrene spheres (1% solids, 400 nm to 2 μm)) were purchased from Thermo Fisher Scientific Inc. (Fremont, Calif., USA). Sodium dodecyl sulfate (SDS, 98%) was purchased from Sigma-Aldrich (St. Louis, Mo., USA). Hydrochloric acid (36.5 to 38.0% w/w) was purchased from Fisher Scientific Inc. (Fair Lawn, N.J., USA). Evaporation materials including gold (99.99%) and nickel (99.995%) were purchased from K. J. Lesker Company (Jefferson Hills, Pa., USA).

Morphology Characterization:

The scanning electron micrographs were taken by a Zeiss Supra 40VP scanning electron microscope. Focused ion beam samples were made and imaged using the Nova 600 SEM/FIB system.

Polystyrene Sphere Monolayer Formation on Silicon Substrates:

The polystyrene nanospheres 14 (1% solids) stock dispersion were centrifuged and re-dispersed in water/ethanol mixture (1:1 ratio) with 2-4% solids. A 2 cm×2 cm silicon substrate and a 22 mm×22 mm glass coverslip were treated in an oxygen plasma (Harrick Plasma, Ithaca, N.Y.) for 1 min to generate hydrophilic surfaces. Next, the silicon substrate 12 was put in a 2" petri dish, ~4 ml water was added to immerse the silicon substrate 12 fully, and then ~50 µl 1 wt % SDS was added. The polystyrene nanosphere 14 dispersion in water/ethanol was slowly added to the water/air interface through a tilted glass coverslip that was placed against the edge of the petri dish to form close-packed monolayers. Then, the water was removed to transfer the polystyrene nanosphere 14 monolayers to the surface of silicon substrate 12. Finally, the silicon substrate 12 was dried in a vacuum desiccator.

Oxygen Plasma RIE of Polystyrene Nanospheres:

An Oxford 80 Plus system was used to tailor the size of polystyrene nanospheres 14. A time-controlled etching process of the polystyrene nanospheres was carried out under a gas mixture of $O_2$ (35 sccm) and Ar (10 sccm) at a pressure of 60 mTorr and radio frequency power of 60 W. The polystyrene-nanosphere 14 coated silicon substrate 12 was heated at 120° C. for ~30 s to fix the nanospheres 14 on the silicon substrate 12.

Deep Reactive Ion Etching of Silicon:

1) Bosch process. An inductively coupled plasma reactive ion etcher (ICP-RIE, Plasma Therm SLR700) was used. It involved alternate cycles of passivation and etching steps. During the passivation step, a flow of 24 sccm $C_4F_8$ and 12 sccm Ar was used at power of 825 W. During the etching step, a flow of 30 sccm $SF_6$ and 12 sccm Ar was used at power of 825 W. 2. Single-step dry etching. The single-step RIE of silicon was completed in a simultaneous flow of 24 sccm $C_4F_8$, 21 sccm $SF_6$, and 5 sccm Ar at a pressure of 12 mTorr with ICP power of 650 W and platen power of 9 W (STS Advanced Oxide Etcher) to achieve silicon pillars/tubes with smooth sidewalls. For both processes, the etching depth of silicon was controlled by the etching time.

Fabrication of $SiO_2$ Hierarchical Nanostructures:

$SiO_2$/Si (500 nm thick $SiO_2$) substrates 12 with polystyrene nanoparticles 14 as the masks were etched by an Oxford 80 Plus using a gas mixture of $CHF_3$ (25-sccm) and Ar (25 sccm) at 35 mTorr to generate the $SiO_2$ hierarchical nanostructures.

Pattern Replication to PDMS Substrates:

A 10:1 mass ratio of Sylgard® 184 elastomer silicone elastomer base and curing agent were thoroughly mixed and then degassed in a vacuum desiccator. This mixture was poured onto the silicon mold (i.e., substrate 12) with hierarchical nanostructures 10 and cured overnight at 65° C. After curing, PDMS stamps were carefully removed from the silicon mold.

Metal Coating:

Desirable substrates were loaded into the vacuum chamber of an electron beam metal evaporator (Kurt J. Lesker Company, Jefferson Hills, Pa.) and held at a base pressure of $1\times10^{-7}$ Torr. Nickel film was deposited at rate of ~1 Å/s, and Au film was deposited at rate of ~0.5 Å/s.

Characterization of Reflection Spectra:

In the characterization of the reflection spectra of the plasmonic hierarchical nanostructures 10, the incident light and reflected light was set to be near normal to the substrate, as illustrated on the left. Note that these settings were also used for the finite-difference time-domain (FDTD) optical simulations. In order to obtain the reflection spectra across the wavelength range from 500 to 6000 nm, two spectrophotometers were used. One spectrophotometer measured the reflection spectra from 500 to 2500 nm and other measured the reflection spectra from 2500 to 6000 nm.

An UV-3101PC UV-VIS-NIR Spectrophotometer (Shimadzu Co., Japan) with an integrating sphere attachment (ISR-3100) was used to collect the reflection spectra of the plasmonic hierarchical nanostructures within the wavelength range (500 to 2500 nm). The scan rate was set at 1 nm/s. A customized polarization modulation-infrared reflection-adsorption spectroscopy (PM-IRRAS) instrument was used to collect the reflection spectra of the plasmonic hierarchical nanostructures in the range of 2500 to 6000 nm. The scan step size was set at 2 nm with medium scan rate. Due to the differences in sensitivities of the two spectrometers, for comparisons to the simulations, the two segments of the reflection spectra were stitched together as follows: Sample i) No changes were made to the reflection spectra from 500 to 2500 nm, and the intensity of reflection spectra from 2500 to 6000 nm was multiplied by 20× in order to combine the spectra. Sample ii) The overall intensity of the reflection spectra obtained from 500 to 2500 nm was increased by 20 (arbitrary units), while the intensity of the reflection spectra from 2500 to 6000 nm was multiplied by 20×. See FIG. 14A.

While embodiments of the present invention have been shown and described, various modifications may be made without departing from the scope of the present invention. For example, while the spherical particles 14 described herein start off as being spherical in shape, the shape may be altered to some extent (e.g., become oblate) in response to one or more etching operations. Nonetheless, the particles 14 still function as an effective resist. The invention, therefore, should not be limited, except to the following claims, and their equivalents.

What is claimed is:

1. A method of manufacturing arrays of nanostructures on a substrate comprising:
(a) assembling a monolayer of packed nanometer- or micrometer-sized spherical polymer particles onto a substrate;
(b) reducing the size of the spherical polymer particles on the substrate by an etching operation specific to the polymer particles;
(c) subjecting the substrate with the reduced sized particles from operation (b) to an etching operation specific to the substrate to generate an array of pillars formed in the surface of the substrate;
(d) reducing the size of the polymer particles of operation (c) by an additional etching operation specific to the polymer particles;
(e) depositing a metallic mask layer on the array of pillars and substrate;
(f) removing the polymer particles of operation (d) from the substrate;
(g) subjecting the substrate with the array of pillars to an etching operation to etch holes in the array of pillars to generate an array of tubes; and (h) removing the metallic mask layer.

2. The method of claim 1, wherein the spherical polymer particles comprise polystyrene spheres.

3. The method of claim 1, wherein the monolayer of packed nanometer- or micrometer-sized spherical polymer particles are formed at a water/air interface and transferred onto the substrate.

4. The method of claim 1, wherein the size of the polymer particles is reduced in operations (b) and (d) by exposure to a plasma.

5. The method of claim 1, wherein the etching of operations (c) and (g) comprise deep reactive ion etching (DRIE).

6. The method of claim 1, wherein the metallic mask layer comprises nickel.

7. The method of claim 1, wherein the metallic mask layer is removed by exposure to an acid.

8. The method of claim 1, wherein the substrate comprises silicon.

9. The method of claim 1, further comprising coating the array of tubes with a metal selected from the group consisting of gold, silver, or aluminum.

10. A method of manufacturing multi-level tower arrays on a substrate comprising:
  (a) assembling a monolayer of nanometer- or micrometer-sized spherical polymer particles onto the substrate;
  (b) reducing the size of the spherical polymer particles on the substrate by an etching operation specific to the spherical polymer particles;
  (c) subjecting the substrate with the reduced size polymer particles of operation (b) to an etching operation specific to the substrate to generate an array of pillars in the surface of the substrate;
  (d) depositing a metal mask layer on the substrate and array of pillars after operation (c);
  (e) reducing the size of the polymer particles of operation (c) by an additional etching operation specific to the polymer particles;
  (f) subjecting the substrate with the array of pillars of operation (e) to an etching operation specific to the substrate to generate multi-level towers; and
  (g) removing the polymer particles from the multi-level towers.

11. The method of claim 10, further comprising prior to removing the polymer particles from the multi-level towers the operations of:
  depositing a metal mask layer on the substrate and a portion of the multi-level towers;
  reducing the size of the polymer particles by an additional etching operation specific to the polymer particles;
  subjecting the substrate with the multi-level towers to an etching operation specific to the substrate to generate additional levels in the multi-level towers.

12. The method of claim 11, wherein the operations of claim 11 are repeated a plurality of times.

13. The method of claim 10, further comprising:
  forming an annular metal mask layer on the multi-level towers prior to removing the polymer particles from the multi-level towers;
  subjecting the multi-level towers to an etching operation specific to the substrate to form a hole or aperture in the multi-level towers.

14. The method of claim 10, wherein the substrate comprises silicon or silicon dioxide.

15. The method of claim 10, wherein the multi-level towers comprise spikes or cones.

16. The method of claim 10, wherein the multi-level towers are subject to an etching operation to reduce the thickness of the multi-level towers.

17. The method of claim 10, wherein the multi-level towers are subject to an etching operation to render the multi-level towers porous.

18. The method of claim 10, wherein the multi-level towers are coated with a metal selected from the group consisting of gold, silver, or aluminum.

19. The method of claim 10, further comprising forming a relief of the multi-level tower arrays in polydimethylsiloxane (PDMS).

* * * * *